(12) United States Patent
Mao et al.

(10) Patent No.: US 10,270,439 B2
(45) Date of Patent: Apr. 23, 2019

(54) HIGH EFFICIENCY RESONANT POWER CONVERTERS AND RESONANT GATE DRIVERS

(71) Applicants: Hengchun Mao, Allen, TX (US); Xuezhong Jia, Allen, TX (US)

(72) Inventors: Hengchun Mao, Allen, TX (US); Xuezhong Jia, Allen, TX (US)

( * ) Notice: Subject to any disclaimer, the term of this patent is extended or adjusted under 35 U.S.C. 154(b) by 236 days.

(21) Appl. No.: 15/095,021

(22) Filed: Apr. 9, 2016

(65) Prior Publication Data
US 2016/0322968 A1 Nov. 3, 2016

Related U.S. Application Data

(63) Continuation-in-part of application No. 14/185,885, filed on Feb. 20, 2014, now Pat. No. 9,344,042.
(Continued)

(51) Int. Cl.
| | |
|---|---|
| *H03K 17/68* | (2006.01) |
| *H03K 17/687* | (2006.01) |
| *H03K 5/08* | (2006.01) |
| *H03F 1/02* | (2006.01) |
| *H03F 1/32* | (2006.01) |

(Continued)

(52) U.S. Cl.
CPC ...... *H03K 17/687* (2013.01); *H02M 3/33546* (2013.01); *H02M 3/33561* (2013.01); *H02M 3/33592* (2013.01); *H03F 1/025* (2013.01); *H03F 1/0222* (2013.01); *H03F 1/0227* (2013.01); *H03F 1/32* (2013.01); *H03F 1/3205* (2013.01); *H03F 1/56* (2013.01); *H03F 3/195* (2013.01); *H03F 3/245* (2013.01); *H03K 5/08* (2013.01); *H02M 2001/0058* (2013.01); *H03F 2200/102* (2013.01); *H03F 2200/15* (2013.01); *H03F 2200/225* (2013.01); *H03F 2200/387* (2013.01); *H03F 2200/541* (2013.01); *H03K 2217/009* (2013.01); *Y02B 70/1433* (2013.01);
(Continued)

(58) Field of Classification Search
CPC ........ H02M 3/33546; H02M 3/33561; H02M 3/33592; H03F 1/0222; H03F 1/0227; H03F 1/025; H03F 1/32; H03F 1/56; H03F 3/195; H03F 3/245; H03K 5/08; H03K 17/687
See application file for complete search history.

(56) References Cited

U.S. PATENT DOCUMENTS

| | | | | |
|---|---|---|---|---|
| 6,031,746 A | * | 2/2000 | Steigerwald | .......... H03F 3/2171 323/225 |
| 6,961,253 B1 | * | 11/2005 | Cohen | ..................... H02M 1/08 363/89 |

(Continued)

*Primary Examiner* — Jue Zhang

(57) ABSTRACT

A device to drive a plurality of power switches in a power converter with an input voltage port having an input voltage includes a drive resonant tank, a switch network, a control block configured to control the turn-on and turn-off of drive switches, and an output port. The drive resonant tank has a resonant inductor, and a resonant capacitor which includes an input capacitance of a power switch. The switch network has a plurality of drive switches, which are controlled such that the drive resonant tank goes through a resonant state and a pseudo clamp state consecutively during a switching period. A gate drive voltage of a power switch fluctuates slightly during the pseudo clamp state. The output port has two terminals coupled to a gate and a source of a power switch respectively.

20 Claims, 35 Drawing Sheets

Related U.S. Application Data

(60) Provisional application No. 61/850,972, filed on Feb. 27, 2013.

(51) Int. Cl.
  *H02M 3/335* (2006.01)
  *H03F 1/56* (2006.01)
  *H03F 3/195* (2006.01)
  *H03F 3/24* (2006.01)
  *H02M 1/00* (2006.01)

(52) U.S. Cl.
  CPC ....... *Y02B 70/1475* (2013.01); *Y02B 70/1491* (2013.01)

(56) References Cited

U.S. PATENT DOCUMENTS

| | | | |
|---|---|---|---|
| 2001/0024373 A1* | 9/2001 | Cuk | H02M 1/44 363/16 |
| 2006/0170043 A1* | 8/2006 | Liu | H02M 1/08 257/341 |
| 2014/0240052 A1* | 8/2014 | Mao | H03F 1/0222 330/302 |

* cited by examiner

HIGH EFFICIENCY RESONANT POWER CONVERTERS AND RESONANT GATE DRIVERS

CROSS REFERENCE TO RELATED APPLICATIONS

This application is a continuation-in-part of US patent application Ser. No. 14/185,885 filed on Feb. 20, 2014, which is related and claims priority to U.S. Provisional Application No. 61/850,972, titled, "High Efficiency Power Amplifiers with Advanced Power Solutions" filed on Feb. 27, 2013, which is herein incorporated by reference.

TECHNICAL FIELD

The present invention relates to power conversion and power amplifiers, and, in particular embodiments, to high efficiency power topologies and control suitable for high efficiency power amplifiers and other demanding applications.

BACKGROUND

Power amplifiers are widely used in wireless communication systems and other electronic devices, especially in mobile devices. To achieve high system efficiency and/or longer battery life, it is very important to maintain high efficiency in power amplifiers.

The power amplifiers in many systems see signals with high peak to average power ratio. Because a typical power amplifier gets its energy from a power supply coupled to the drain (or the collector if a transistor is used) of its main power switch (a MOSFET or a transistor), its power efficiency can be improved by changing the drain voltage of its main power switch through changing the voltage of its drain power supply according to the envelope of the signal being processed by the power amplifier. When the signal envelope has high bandwidth as often seen in today's wireless systems, changing the voltage of drain power supply may cause the output signal of the power amplifier to be distorted.

Moreover, as the bandwidth of the signal increases, the power supply's control bandwidth should be increased accordingly. This put very high burden into the power supply, and the efficiency of the power supply is low with existing technology.

Improvements are needed to reduce the signal distortion in a power amplifier with variable drain voltage, and to increase the efficiency of the drain power supply.

SUMMARY OF THE INVENTION

These and other problems are generally solved or circumvented, and technical advantages are generally achieved, by preferred embodiments of the present invention which provides an improved resonant power conversion.

According to one embodiment of this disclosure, a device is configured to drive a plurality of power switches in a power converter with an input voltage port having an input voltage. The device comprises a drive resonant tank, a switch network having a plurality of drive switches, a control block configured to control the turn-on and turn-off of drive switches, and an output port. The drive resonant tank comprises a resonant inductor, and a resonant capacitor which comprises an input capacitance of a power switch. The switch network are controlled such that the drive resonant tank goes through a resonant state and a pseudo clamp state consecutively during a switching period. During the pseudo clamp state, a gate drive voltage of a power switch fluctuates slightly. The output port has two terminals coupled to a gate and a source of a power switch respectively.

According to another embodiment of this disclosure, a system comprises an input port having an input voltage, a power converter comprising a switch network having a plurality of power switches and a resonant tank, a gate drive circuit for driving the power switches, a control circuit configured to adjust a switching frequency of the power converter, and a resonant mode selection circuit. At least one of a resonant capacitor and a resonant inductor in the resonant tank is configured to have different values, and the resonant mode selection circuit is configured to change a value of at least one of the resonant inductor and the resonant capacitor in response to a variation in the input voltage or in a control circuit signal.

According to yet another embodiment of this disclosure, an apparatus comprises an input port having an input voltage, a transformer having a primary winding coupled to the input port and a secondary winding, a power switch coupled between the primary winding and the input voltage port, a primary resonant tank, a secondary resonant tank, a control block configured to control a duty cycle and a switching frequency of the power switch, a gate drive circuit, an output port having an output voltage, and a switch network coupled between the secondary resonant tank and the output port. The primary resonant tank comprises a primary resonant capacitor coupled to the power switch and the transformer, and a primary resonant inductor comprising the primary winding. The secondary resonant tank comprises a secondary resonant capacitor coupled to the secondary winding, and a secondary resonant inductor comprising the secondary winding.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in power amplifiers and power supply technologies for power amplifiers. The invention may also be applied, however, to a variety of other electronics systems, including integrated circuits, CPUs (central processing units), computers, telecom equipments, any combinations thereof and/or the like. Hereinafter, various embodiments will be explained in detail with reference to the accompanying drawings.

Figure 1:
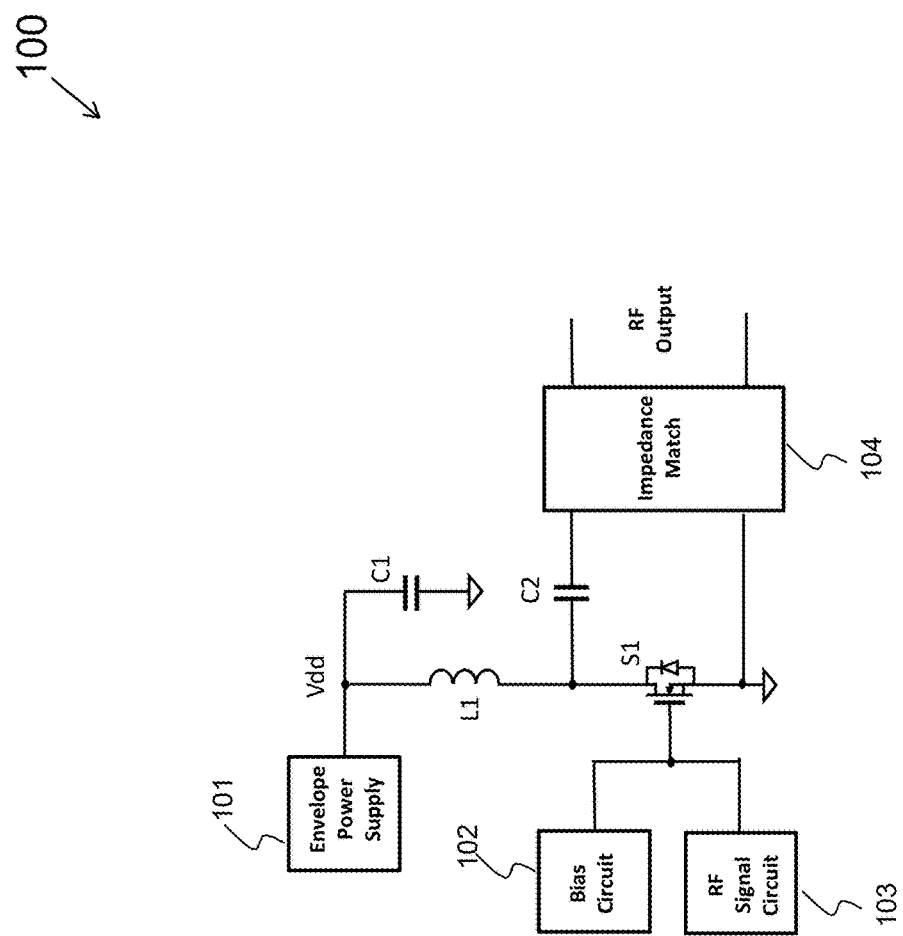
FIG. 1 illustrates a schematic diagram of a power amplifier.

Often a power amplifier is required to process a signal with a variable amplitude envelope which is related to the information to be communicated. The envelope may have high-frequency components up to several tens or even hundreds of MHz in radio frequency (RF) communication systems and devices and other equipment. The carrier frequency is usually much higher than the highest component frequency of the envelope. In the last few decades, people have tried to develop high efficiency technologies, such as envelope tracking (ET) and envelope elimination and restoration (EER), for power amplifiers intended for variable envelope applications. FIG. 1 shows a block diagram for such a high efficiency amplifier. S1 is the main switch. Although a MOSFET is shown as an example, it can also be a bipolar transistor (BJT) or other switching devices. L1 is the RF choke, C2 is the DC blocking capacitor to prevent dc component from getting into the RF output. C1 is the bypass capacitor to filter out noise in the power path. The envelop power supply 101 provides drain power to the switch, and is designed to follow the envelope information of the signal to be amplified. The bias circuit sets up the switch's operating point, and RF signal circuit conditions the signal to be amplified and couples it to the switch. The impedance match circuit 104 matches the impedance of S1 with the impedance of the RF load connected to the power amplifier.

With EER technology (such as in polar modulation), S1 works in switching mode (such as in Class E mode). The envelope power supply's output Vdd is basically a replica of the envelope of the RF signal, and the RF signal circuit for the gate (or base if a BJT is used) in the power amplifier just processes the phase information of the RF input. If the timing of the envelop signal is aligned perfectly with the phase signal, the RF output can have the right envelope and phase information. Because in the switching mode the switch S1 works in two low loss states: saturation (ON) or block (OFF), the EER technique theoretically has high power efficiency. However, it is extremely difficult to achieve a good phase and envelope alignment, and it's very challenging to implement a fast envelope power supply, so it's very expensive and difficult to implement EER technology in practice.

With ET technology, S1 works in linear mode (such as in Class A, Class AB or Class B mode). Vdd tracks but is slightly higher than the amplitude of RF output signal, and the gate signal is the same as in a normal linear amplifier (i.e. has both amplitude and phase information). With ET technology, the transistor's power loss is greatly reduced compared to that in a normal linear power amplifier due to the reduced voltage applied to the transistor. As a result, the ET power amplifier also achieves high power efficiency. ET is a very promising technology for high efficiency linear power amplifiers, but similar to the limitations of EER technology mentioned above, ET technology also faces tremendous challenges:

The envelope power supply has to provide power with very wide frequency spectrum. For example, in LTE technologies, the RF signal spectrum may have a bandwidth up to 20 MHz, but the envelope signal spectrum may have an effective bandwidth up to 100 MHz. The state of art power technology cannot process such wide-bandwidth power effectively;

The fast changing envelope power applied to the drain path of an ET power amplifier causes significant RF signal distortion, and thus tremendous predistortion needs to be used to regain the linearity of the amplification. Such predistortion normally requires a large amount of calibration work and complex procedure, and thus significantly increases the implementation cost.

The current ET technology doesn't consider the internal dynamics of a power amplifier to the drain power, and thus cannot be optimized for efficiency improvement reliably.

In this disclosure, new technologies addressing the above issues will be proposed and discussed in details. Although the description is made in the context of ET technology, the principles can also be applied to EER technology and polar modulation, as they also involve interaction between the fast envelope power supply and the power amplifier it powers, and the need of very fast dynamic power supplies.

Figure 2:
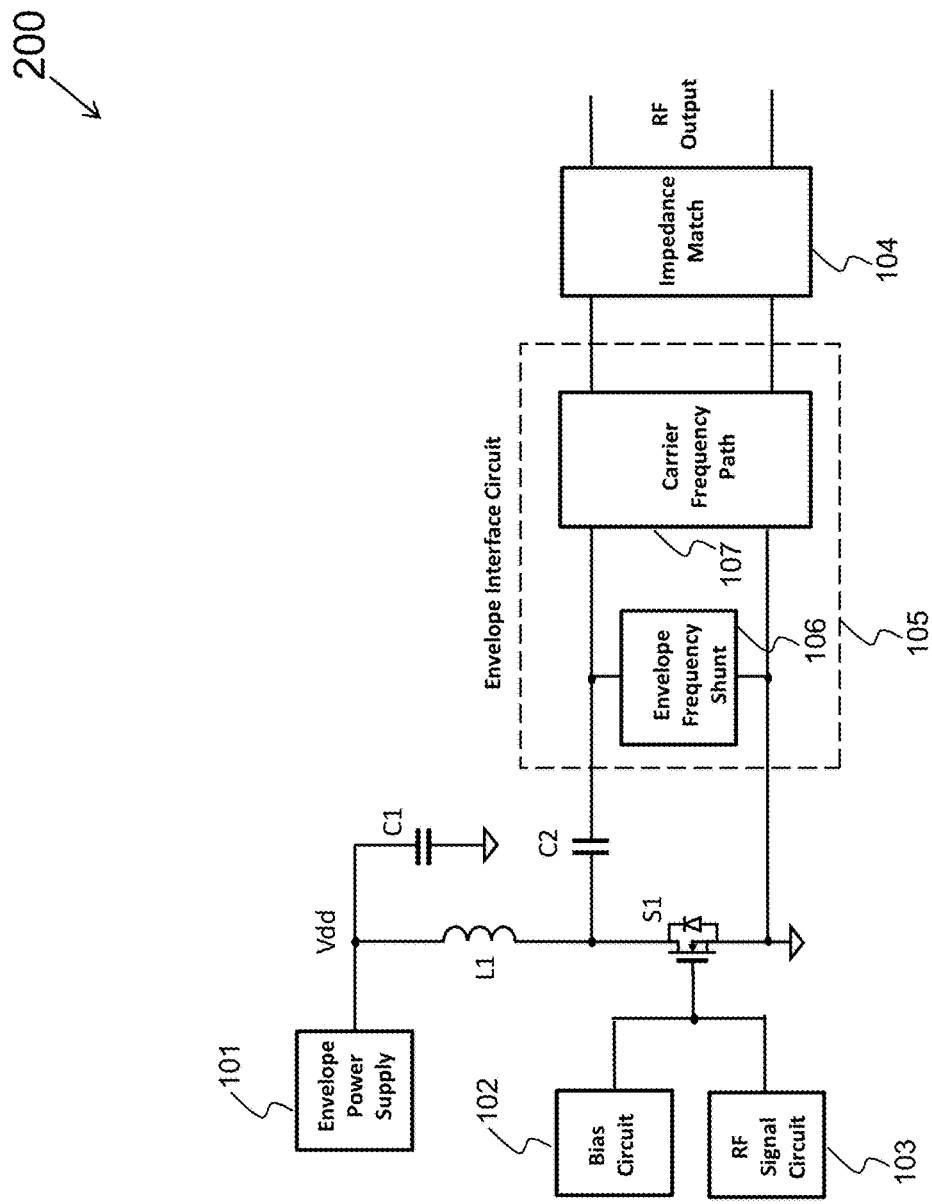
FIG. 2 illustrates a schematic diagram of a first illustrative embodiment of a power amplifier in accordance with various embodiments of the present disclosure.

FIG. 2 shows a simplified block diagram of a new ET+ technology. Although a single transistor Class A power amplifier is shown, similar technologies can be applied to other power amplifier topologies, such as Class AB, Class B, Push-pull, Class E, Class F etc. Compared to the topology in FIG. 1, the ET+ topology has an envelope interface circuit 105 between the power switch and the optional impedance matching circuit 104. In an embodiment in accordance with the present invention, the envelope interface circuit 101 can be part of the impedance matching circuit 104. As well known in the industry, harmonic termination function can be also part of the impedance matching circuit. The envelope interface circuit consists of an envelope frequency shunt 106 and a carrier frequency path circuit 107. The circuit 106 presents a low impedance path to the envelope signal, thus allowing the envelope current to flow through it and return to the envelope power supply 101 with little impact to the output RF signal. The circuit 106 presents a high frequency to the carrier frequency, and thus doesn't impact RF signal amplification significantly. On the contrary, the carrier frequency path circuit 107 presents a high impedance path to the envelope signal, forcing the envelope signal to go through circuit 106. To carrier frequency signal, the circuit 107 presents a low impedance path, allowing the RF output signal to pass through it without much distortion or attenuation. With this architecture, clear envelope signal path (with relatively lower frequency contents) and carrier frequency path (with relatively higher frequency contents) are established. As a result, the variable amplitude power applied to the drain path of the power switch may not cause significant distortion to the RF output, significantly reducing the requirements of predistortion and its associated costs. This concept can be easily extended to other power amplifier architectures, such as EER and polar modulation.

Figure 3:
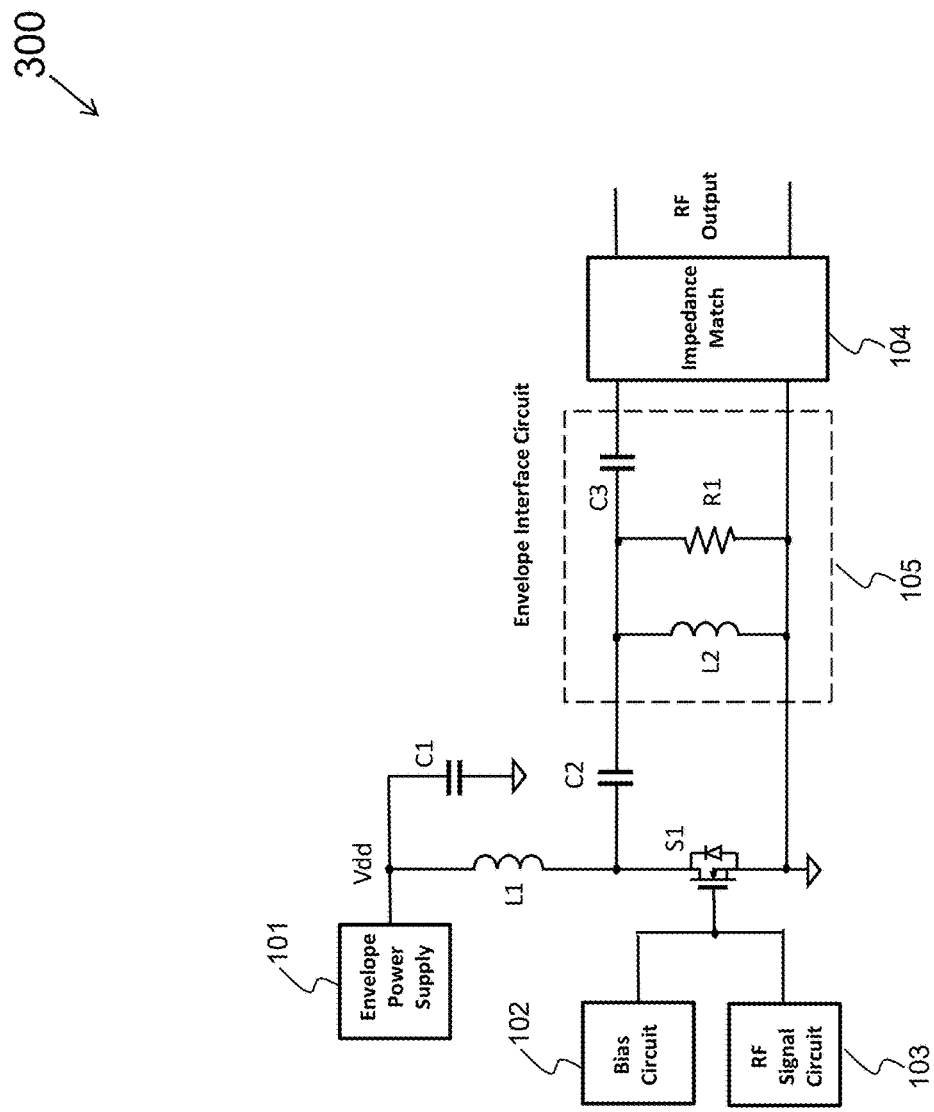
FIG. 3 illustrates a detailed schematic diagram of an embodiment of a power converter in accordance with various embodiments of the present disclosure.

FIG. 3 shows a more detailed block diagram of the ET+ technology. The envelope interface circuit 106 is implemented with simple circuits. In one embodiment, the envelope frequency shunt circuit 106 is implemented as an inductor L2 and an optional resistor R1. R1 also damps possible resonance between reactive components, and so improves the signal quality in the amplifier. Moreover, R1 allows the drain voltage to change relatively quickly with the change of the bias current or bias voltage to the switch S1 when needed, and thus improves the envelope controllability of the architecture.

Figure 4:
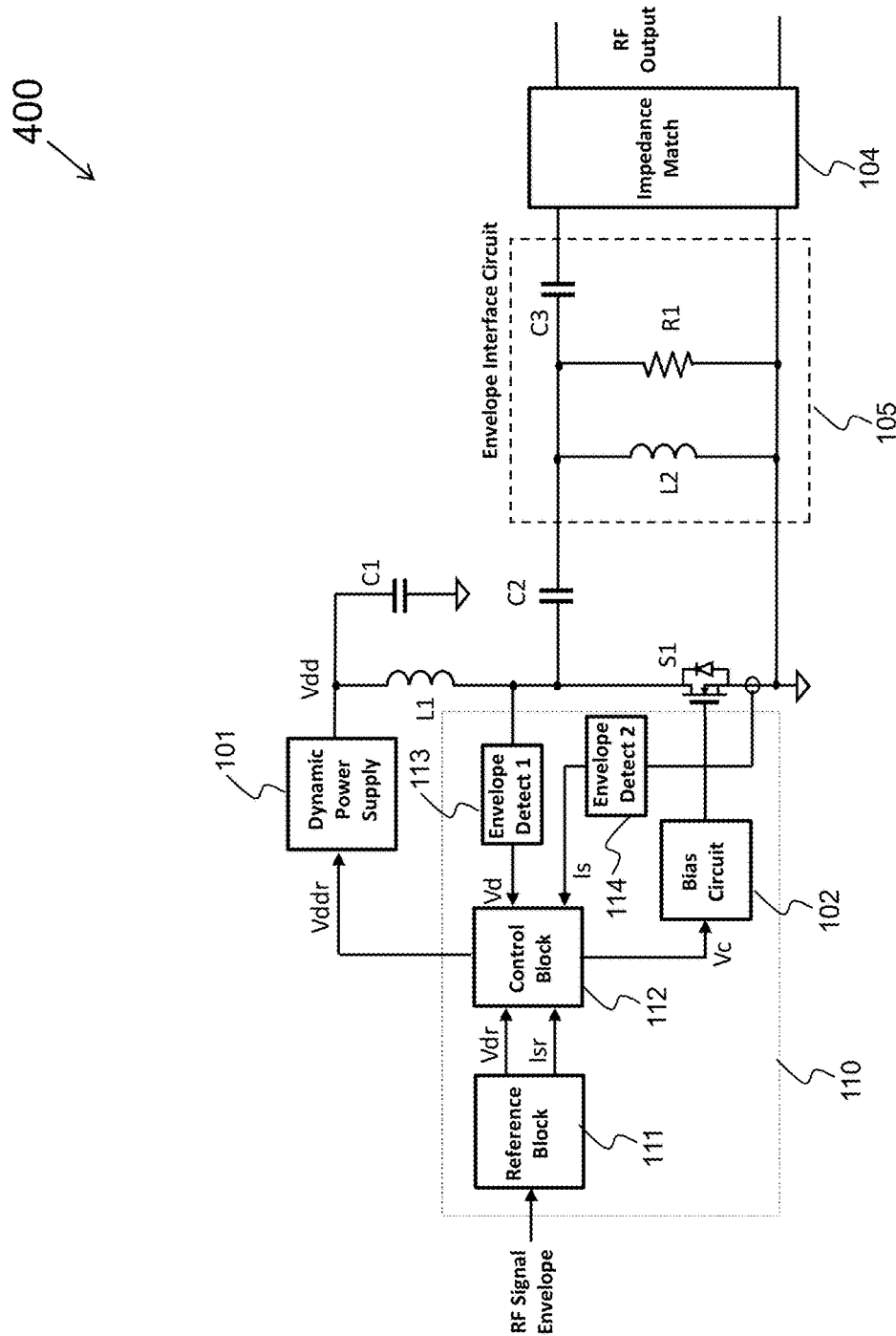
FIG. 4 illustrates a schematic diagram of an embodiment of a power amplifier in accordance with various embodiments of the present disclosure.
Figure 5:
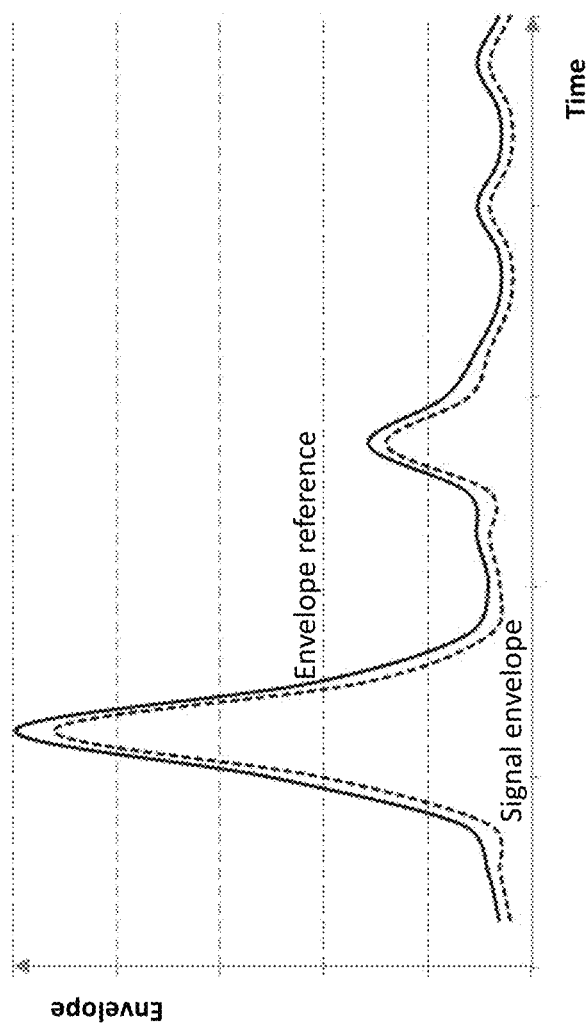
FIG. 5 illustrates an embodiment of an envelope reference in accordance with various embodiments of the present disclosure.

One of the key aspects to achieve high performance and high efficiency in power amplifiers is to operate the switch at the right operating point. As a minimum requirement, the valleys (the lowest points of the waveform) of the drain voltage should be just slightly higher than zero at any point of time, and the valleys of the source current should be just slightly higher than zero under all conditions too. This requires the switch be biased according to the envelope of the RF input (or output) signal. As the envelope bandwidth increases over time for higher rates of information transfer, the drain voltage envelope of the switch (Vd) can have significant deviation from the power source voltage Vdd due to the complex dynamics of the power amplifier. As the envelope bandwidth is much lower than the carrier frequency, the envelope dynamics in FIGS. 3 and 4 is determined mainly by L1, C2, L2 and R1, and also depends on the characteristics of the power switch S1. Proper control is needed to ensure the operating point of S1 to follow the signal envelope properly. In FIG. 4, an envelope reference block 111 converts the RF signal amplitude at input or output of the power amplifier to envelope reference signals Vdr for the drain voltage and Idr for the source current of S1. The reference is based on the signal envelope, and a buffer signal is added to the signal envelope to make sure that the envelope reference is higher than the required signal envelope by a certain margin, as is exemplified by FIG. 5. The buffer value can be fixed or adjusted according to actual operation so that the performance can be optimized. Also, the reference signals may not have the exact replica of the envelope signal, and some of the highest frequency components in the envelope signal may be reduced or removed from the reference signals to reduce implementation complexity and cost. An envelope detect circuit 113 is coupled to the drain of S1, so its voltage envelope Vd is sensed and used as a feedback signal. Similarly, the source current of S1 is sensed and coupled to an envelope detect circuit 114 to generate the envelope signal Is of the source current. A control block 112 may consist of feed-forward function, feedback function and any combination thereof. The block 112 processes the reference signals Vdr, Isr and feedback signals Vd and Is, to generate the drain power reference Vddr, and bias control reference Vc. The dynamic power supply 101 generates a drain power Vdd according to Vddr, while the bias control circuit 102 uses Isr as the reference to control the bias of S1. The RF signal conditioning and control, which may involve functions such as amplification, delay, filtering, alignment etc are performed by the RF signal circuit and are not discussed in details here, as they do not directly contribute to the envelope control. Although voltage signals are used to describe the envelope signal Vd, Is and their references, some or all of these signals can also be current signals.

Figure 6:
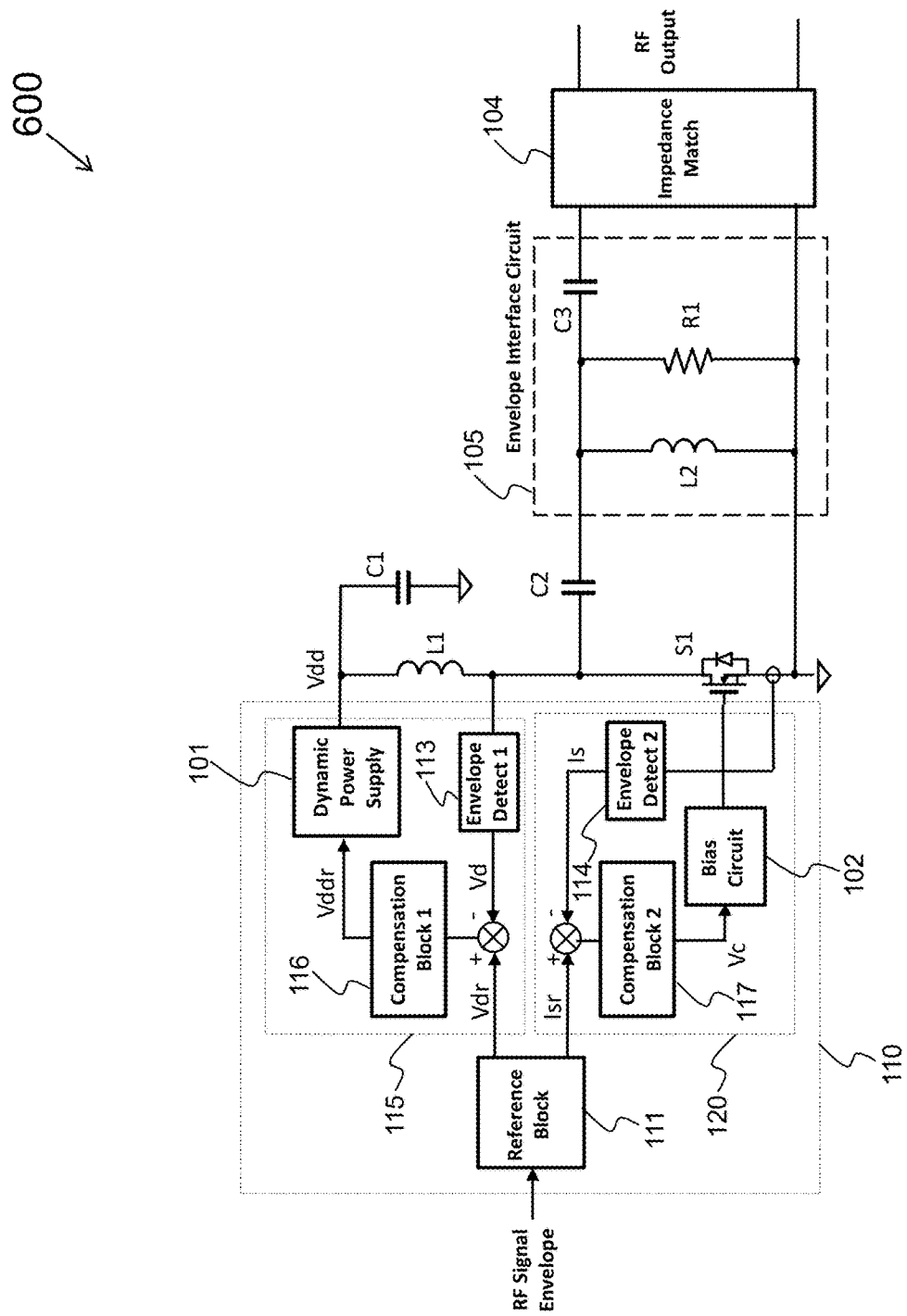
FIG. 6 illustrates an embodiment of a power amplifier in accordance with various embodiments of the present disclosure.
Figure 7:
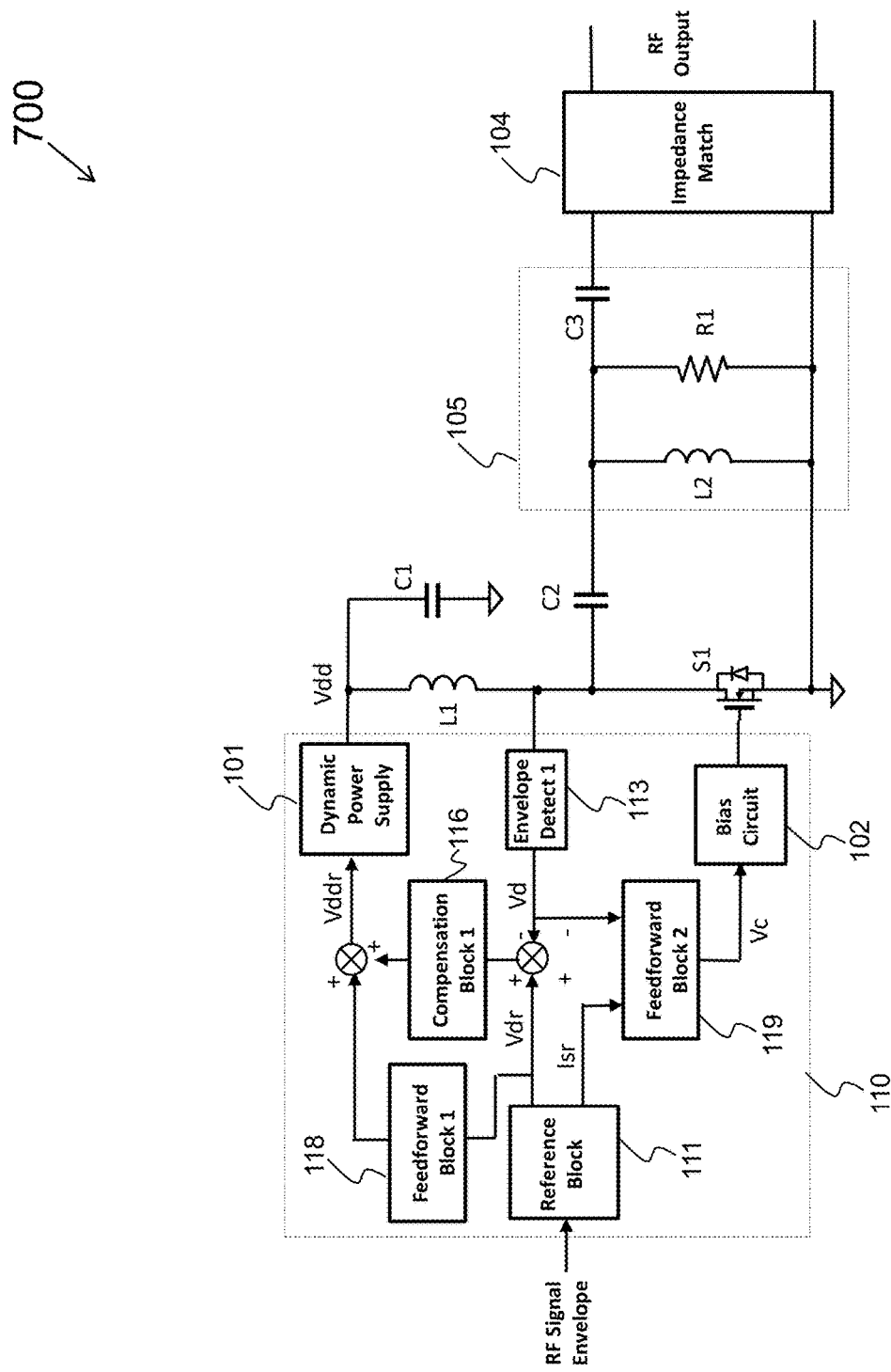
FIG. 7 illustrates an embodiment of a power amplifier with various embodiments of the present disclosure.

The control architecture in FIG. 4 can have many different implementations. FIG. 6 shows a preferred embodiment, in which both the drain voltage envelope and source current envelope are controlled through feedback control. A difference block generates the drain voltage envelope error signal by comparing the reference signal Vdr and the envelope feedback signal Vd. Then the error signal is processed by compensation block 115 to generate the drain power reference Vddr. Another difference block generates the source current envelope error signal by comparing the reference signal Isr and the envelope feedback signal Is. Then this error signal is processed by compensation block 117 to generate the bias control voltage Vc. FIG. 7 shows another preferred embodiment in which both feedback control and feed-forward control are used to accomplish the envelope control function. In accordance with this embodiment, a feed-forward control block 118 is used to process the reference signal Vdr. Such feed-forward function can consider known effects of the power amplifier dynamics. However, due to parameter variations and other deviation from ideal condition, it may not be practical and economical to rely on the feed-forward control alone for the drain voltage envelope control. Therefore, a feedback control block 116 similar to the one in FIG. 6 is also included to fine tune the control action for the drain voltage. The outputs of the block 118 and the block 116 are summed together to adjust the output of the dynamic power supply 101. Because of the added feed-forward control, the operating range and requirements of the feedback control in FIG. 7 can be lower than that in FIG. 6. Since the low-frequency dynamics between the source current and gate voltage of a switch is usually simpler than the relationship between the drain voltage and power input, it's possible to use just feed-forward control for the source current envelope control, as is shown in FIG. 7 (through feedforward block 119). However, if the effect of the drain voltage on the gate voltage (the Miller effect) is to be considered, an optional link can be established by sending the drain envelope signal Vd into the feed-forward block for the source current control, so proper measures can be taken to reduce or eliminate the miller effect in the source current.

Figure 8:
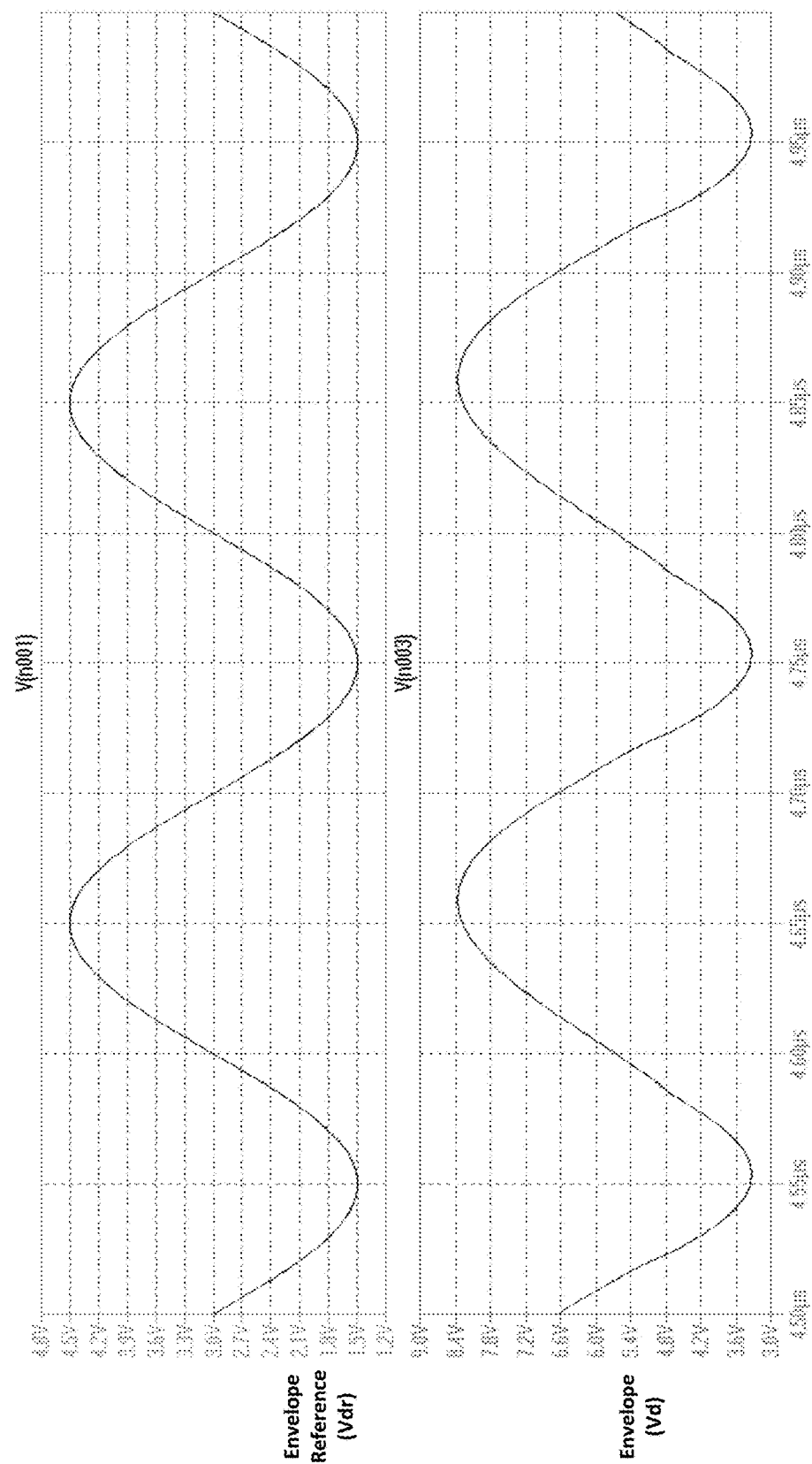
FIG. 8 illustrates simulated waveforms of a power amplifier in accordance with various embodiments of the present disclosure.

FIG. 8 shows simulated waveforms of a drain voltage envelope and its reference in an embodiment. Clearly, with proper design the drain voltage envelope can be controlled to follow its reference closely.

A key aspect of the above implementation is to implement a high-efficiency dynamic power supply with very wide bandwidth. Generally, to achieve a high efficiency power conversion, a switching power converter is preferred over a linear power supply. However, a state of art switching power converter may not be able to have wide enough bandwidth. Some people proposed to use a combination of switching power converter and a linear power supply in a series or parallel configuration. Such combination naturally has relatively low efficiency and high control complexity. Another proposed method is to use a multi-output power supply followed by a voltage selection circuit, and the voltage selection circuit selects one of the voltages as the output of the dynamic power supply. However, to achieve a good result, the number of the voltages should be high, thus resulting in high implementation cost.

Figure 9:
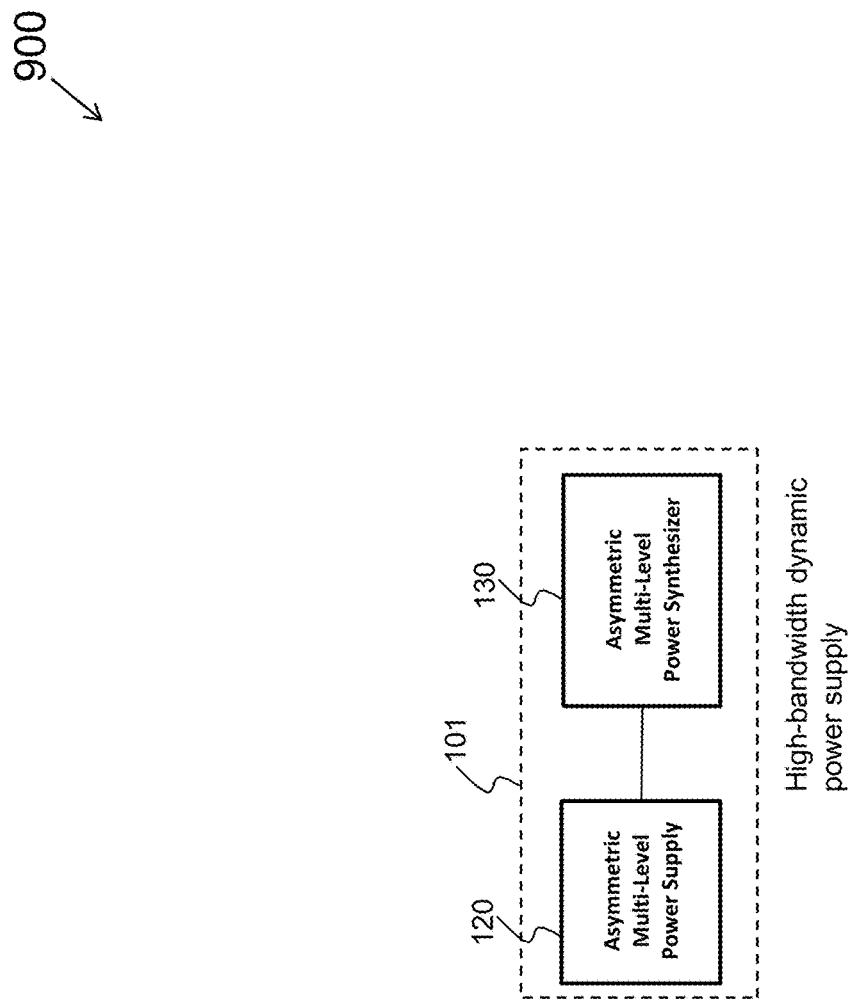
FIG. 9 illustrates an embodiment of a power supply architecture in accordance with various embodiments of the present disclosure.

A new power architecture is shown in FIG. 9 for fast dynamic power supplies. A multi-output power supply 120 with a limited number of different output voltage levels are followed by an asymmetric multi-level power synthesizer 130. The power synthesizer 130 adds its input voltages in different ways so that its output voltage has a much higher number of voltage levels than its number of input voltages.

Figure 10:
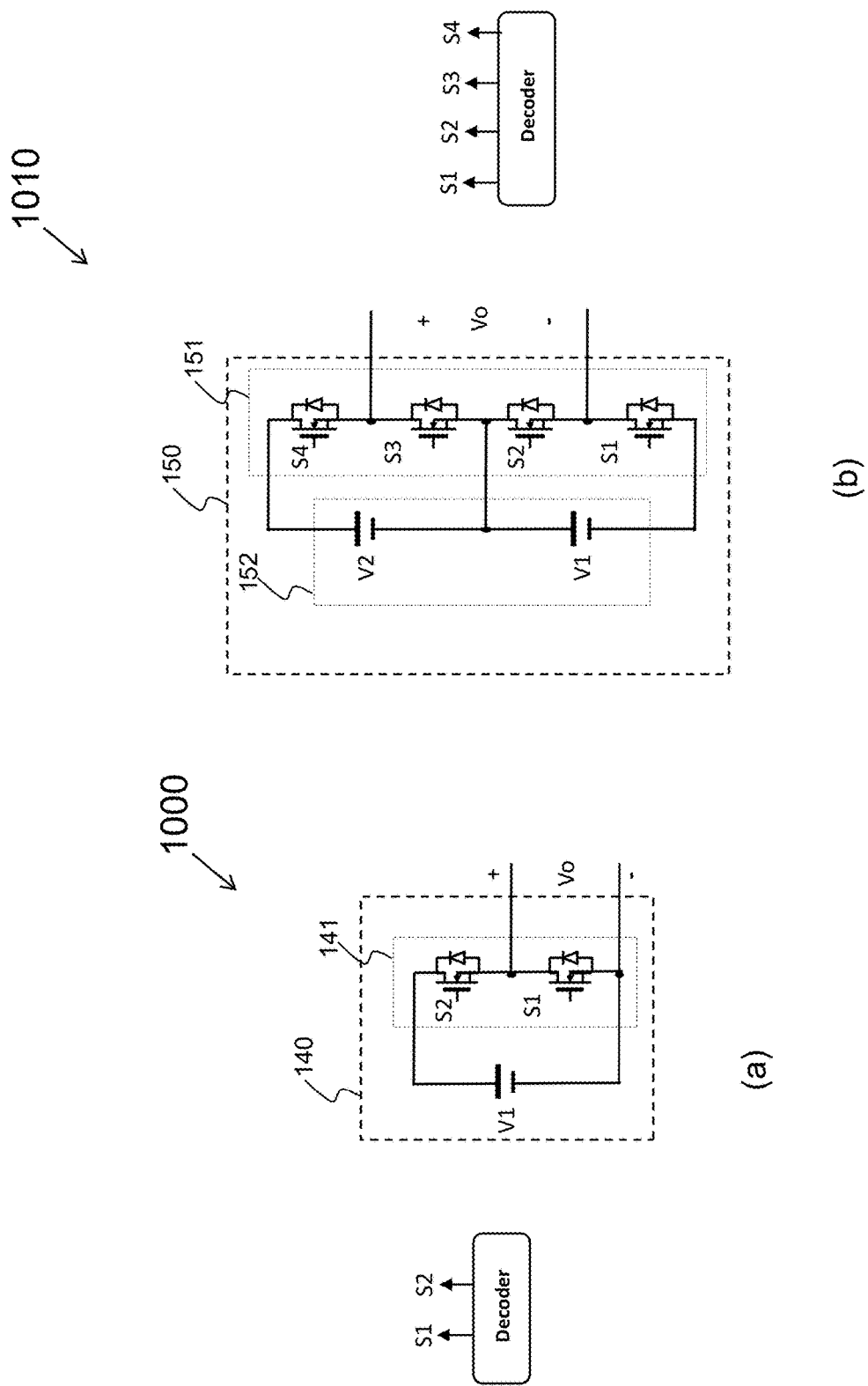
FIG. 10 illustrates embodiments of basic cells of an asymmetric multi-level power synthesizer in accordance with various embodiments of the present disclosure.

FIG. 10 shows the basic cells of an asymmetric multi-level synthesizer. FIG. 10(a) is a two-level cell. Its output is zero when S1 is ON, and V1 when S2 is ON. S1 and S2 are controlled to be in complementary mode with a short transition between states in which both switches are off to avoid cross conduction. FIG. 10(b) shows a four-level cell, with an asymmetric input voltage pair 152, and a four-switch network 151 consisting of a switch pair S1 and S2 in a totem pole configuration, and a second switch pair S3 and S4 in another totem pole configuration. An output terminal is coupled to the common node of each totem pole (i.e. at the junction of the top switch and the bottom switch in the pair). Two voltage sources at the input can have a substantially doubling relationship as described above: V2=2*V1. There are 4 possible states:

S1 and S4 OFF, S2 and S3 ON: Vo=0;
S1 and S3 ON, S2 and S4 OFF: Vo=V1;
S2 and S4 ON, S1 and S3 OFF: Vo=V2=2V1;
S1 and S4 ON, S2 and S3 OFF: Vo=V1+V2=3V1;

Again, the S1 and S2 switch pair, as well as the S3 and S4 switch pair, are controlled to be in complementary mode so at most one switch conducts in a pair at any time. There is a short transition period if the switches in a pair need to change states during which both switches are off to avoid cross conduction. With this structure, if the input voltages of synthesizer have a doubling relationship between them (such as V2=2*V1, V3=2*V2 and so on), the synthesizer basically becomes a binary encoder of voltages (power), and the levels of the output voltage have even step size between them. For example, if the multiple-output power supply's output includes 1V and 2V, then the output of the synthesizer can be 0V, 1V, 2V, and 3V. Generally, n voltages at the input of the synthesizer can be synthesized into $2^N$ different voltage levels at the output using 2N switches. However, in other embodiments the input voltages may not follow the doubling relationship precisely and the step size between adjacent voltage levels does not have to be the same in the whole range. Generally, it is desired that the doubling relationship substantially to achieve good performance. For example, the higher voltage in a four-level cell should be maintained within a range of 1.5 to 2.5 times the lower voltage. Although the doubling relationship will be used in the following description, the principles of power conversion, power synthesizer and control can be easily modified for other voltage relationships.

Figure 11A:
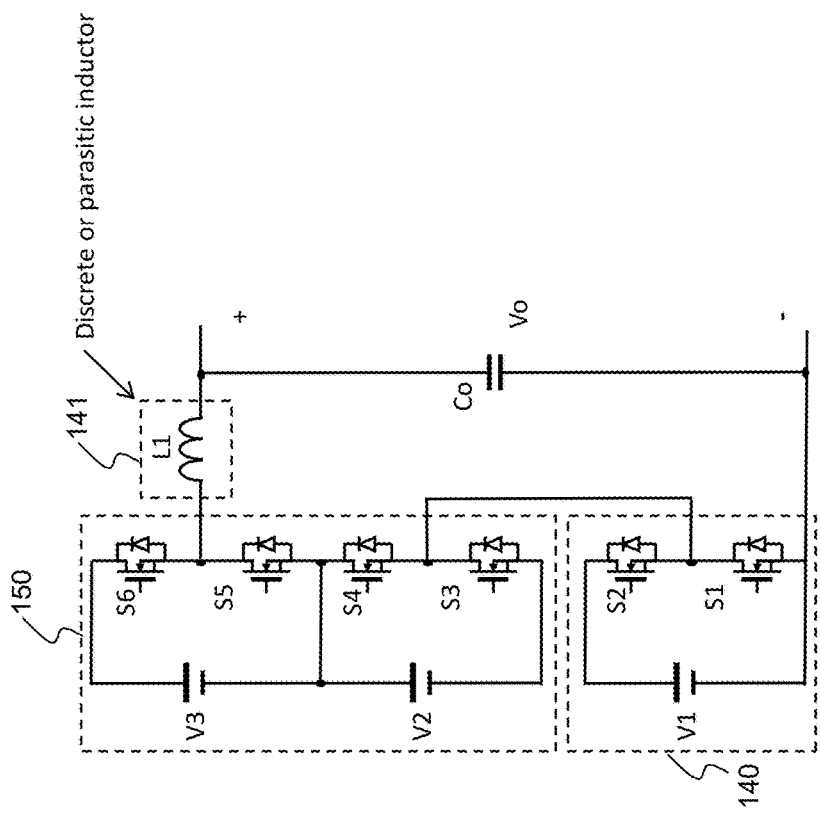
FIG. 11(a) illustrates embodiments of an asymmetric multi-level power synthesizer in accordance with various embodiments of the present disclosure.
Figure 11B:
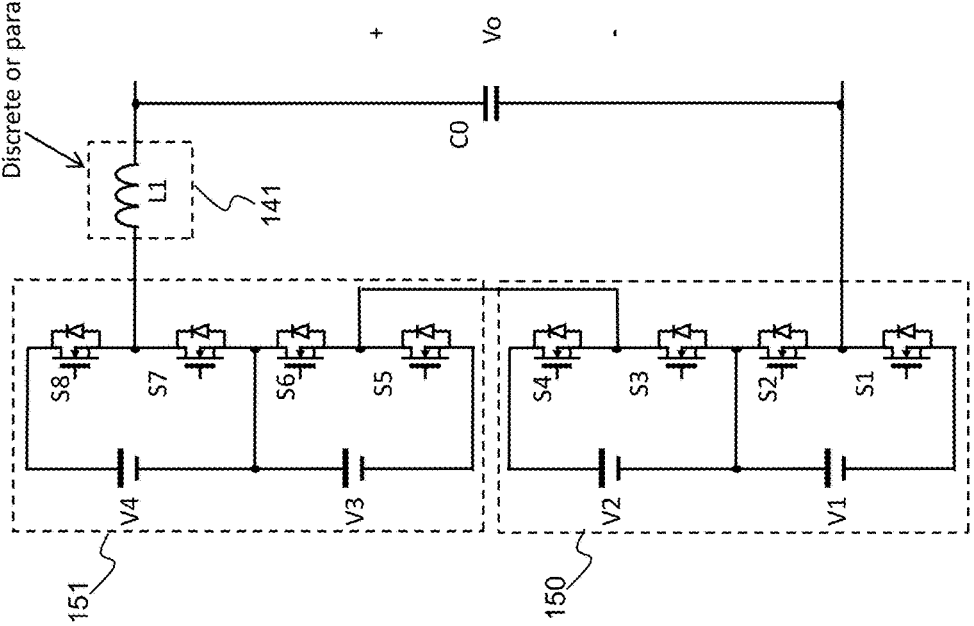
FIG. 11(b) illustrates embodiments of an asymmetric multi-level power synthesizer in accordance with various embodiments of the present disclosure.

Any number of two-level cells and four-level cells can be connected in series by putting their output voltages in series to get a higher number of voltage levels. For example, a configuration with a two-level cell in series with a four-level cell makes an 8-level synthesizer, and a configuration with a four-level cell directly in series with another four-level cell makes a 16-level synthesizer. Note that the input voltages of the adjacent cells should also follow a voltage doubling relationship, i.e. the lower input voltage in the cell with higher voltages should be twice the higher input voltage in the cell with lower voltages. More voltage levels can be obtained by putting more cells in series, as this structure is easily expandable. Generally, a switch network with a N1-switch cell and a N2-switch cell is capable of producing N1 times N2 voltage levels. When one more cell with N3 switches is added, the number of voltage levels the switch network can produce is increased to N3 times the original number of voltage levels. Also, if a switch network has N input voltages, it is capable of producing $2^N$ voltage levels using 2N switches. FIG. 11(a) shows examples of an 8-level synthesizer, and FIG. 11(b) shows a 16-level synthesizer. The impedance network 141 is coupled between the switch networks and the output and reduces the current flowing through the switches during the switching transition between different states, and thus increases the efficiency. The impedance network has naturally filtering function working together with the output capacitor Co. In one preferred embodiment, the impedance network is an inductor, names as L1. L1 and the output capacitor Co may become part of a resonant tank. The value of L1 should not be too high to avoid significant voltage oscillation at the output. In a preferred embodiment, the characteristic impedance $$Zo = \sqrt{\frac{L1}{Co}} \approx Rs,$$

where Rs is the resistance in the current path inside the power synthesizer, including the switch resistances, connection resistance, and resistance of L1. This means the resonant tank consisting of L1 and C1, as well as Rs has a quality factor (defined as Zo/Rs) of substantially close to 1, for example in the range of 0.4 to 2.5. L1 can be a discrete inductor, or the parasitic inductance in the current path of the power synthesizer including the package inductances of the switches, and any combination thereof. In a preferred embodiment, Co can be placed at or inside the power amplifier the synthesizer powers. If the synthesizer and the power amplifier are in different dies or different packages, the parasitic inductance from the packages and interconnection between them may be enough to serve the purpose of L1.

As explained above, an asymmetric power synthesizer behaves like a power encoder. The drive signals for the switches in a power synthesizer can be obtained from a decoding process of the digital representation of the desired voltage. If the desired voltage is not in a digital format originally, an ADC converter can be used to digitize the required value. This control scheme is especially suitable for digital implementation.

Figure 12:
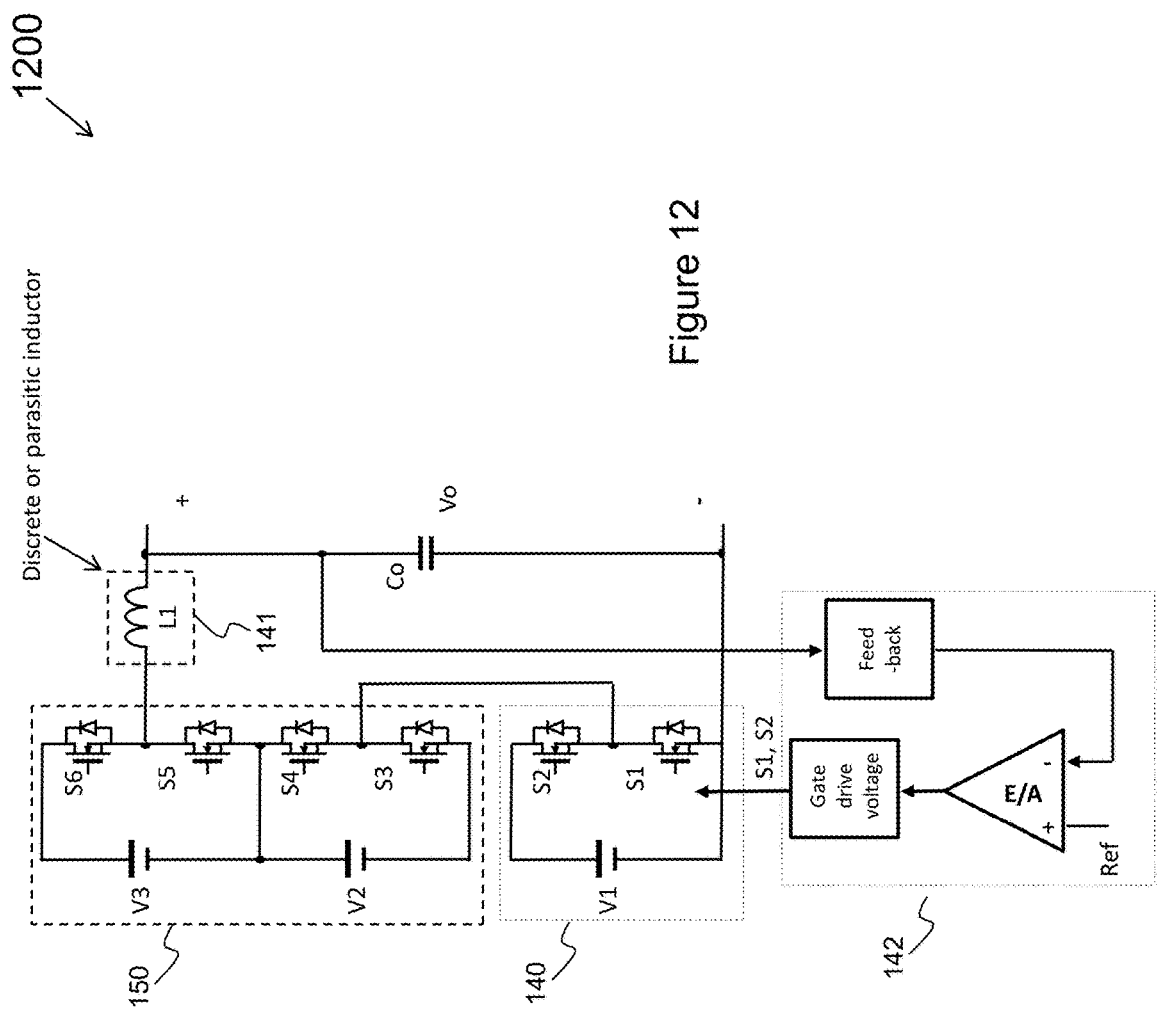
FIG. 12 illustrates an embodiment of a multi-level power synthesizer with linear control in accordance with various embodiments of the present disclosure.

The output voltage of a power synthesizer as described above has discrete values as it changes from one level to another level rapidly. Sometimes it's desirable to have a smoother and more accurate output. A linear regulator can be added at the output to achieve the smoothing function during a level change and/or to realize accurate voltage control. This linear regulation can also be implemented by controlling the gate drive voltage amplitude of switches within the synthesizer. FIG. 12 shows an example, with a four-level symmetric cell 150 and another four-level cell 151, and an impedance cell 141, and output voltage C0. Again, the impedance network 141 reduces the current flowing through the switches during the switching transition between different states, and thus increases the efficiency. The impedance network has naturally filtering function working together with the output capacitor Co. In one preferred embodiment, the impedance network is an inductor, names as L1. L1 and the output capacitor Co may become part of a resonant tank. A control circuit 142 is used to adjust the amplitude of the driving voltage of S1 and S2. The timing of S1 and S2's gate drive is still controlled by the decoder discussed above, and other switches are still controlled by the decoder. The linear control of S1's and S2's drive voltage changes the resistance of this switch pair, and thus can achieve fine-tune regulation of the output voltage of the power synthesizer. This linear control can also be used to reduce the output oscillation if needed. Obviously, the range of the linear adjustment of the output voltage can be less than 1 step size of the voltage levels, and thus high efficiency can still be achieved. This is a simple and low cost implementation of accurate and fast dynamic control in dynamic power supplies.

Figure 13:
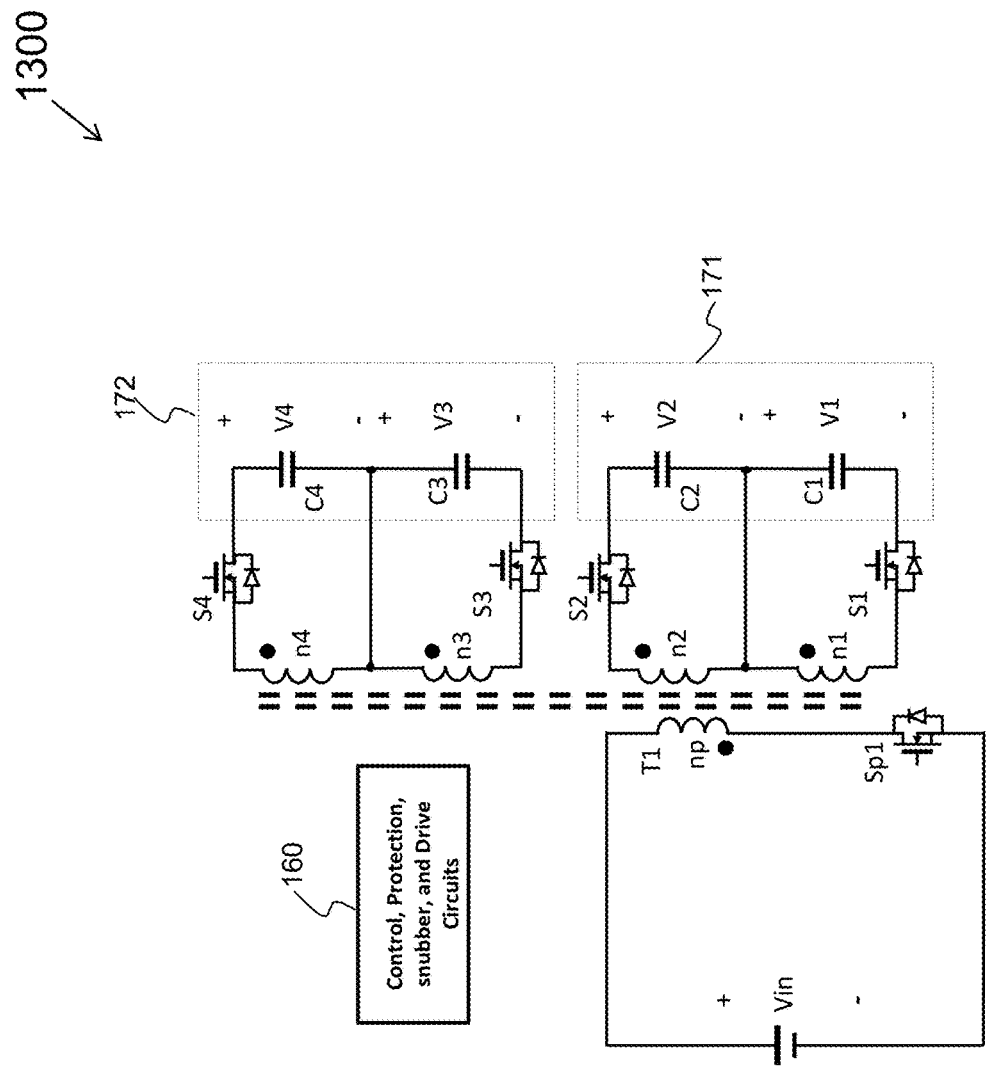
FIG. 13 illustrates an embodiment of a multi-output power converter in accordance with various embodiments of the present disclosure.

The power synthesizer needs multi voltage rails at the input. These voltage rails can be generated by multi-output power supplies. Such power supplies can be implemented with different topologies, such as flyback converters, forward converters, etc. FIG. 13 shows an arrangement with a flyback topology with 2 pairs of output voltages (171 and 172, more outputs can be added easily by repeating the pattern). If the relationship between the number of turns of the secondary windings has a doubling relationship:

$$n2=2*n1, n3=2*n2, n4=2*n3$$

Then ideally the output voltage will also have a doubling relationship:

$$V2=2*V1, V3=2*V2, V4=2*V3$$

By controlling of duty cycle of the primary switch Sp1, the output voltages can be regulated to the desired value. S1 through S4 in the secondary are synchronous rectifiers and can be replaced with diodes if desired. The output voltages can be easily arranged into asymmetric voltage pairs (171 and 172) to suit the needs of a power synthesizer.

Figure 14:
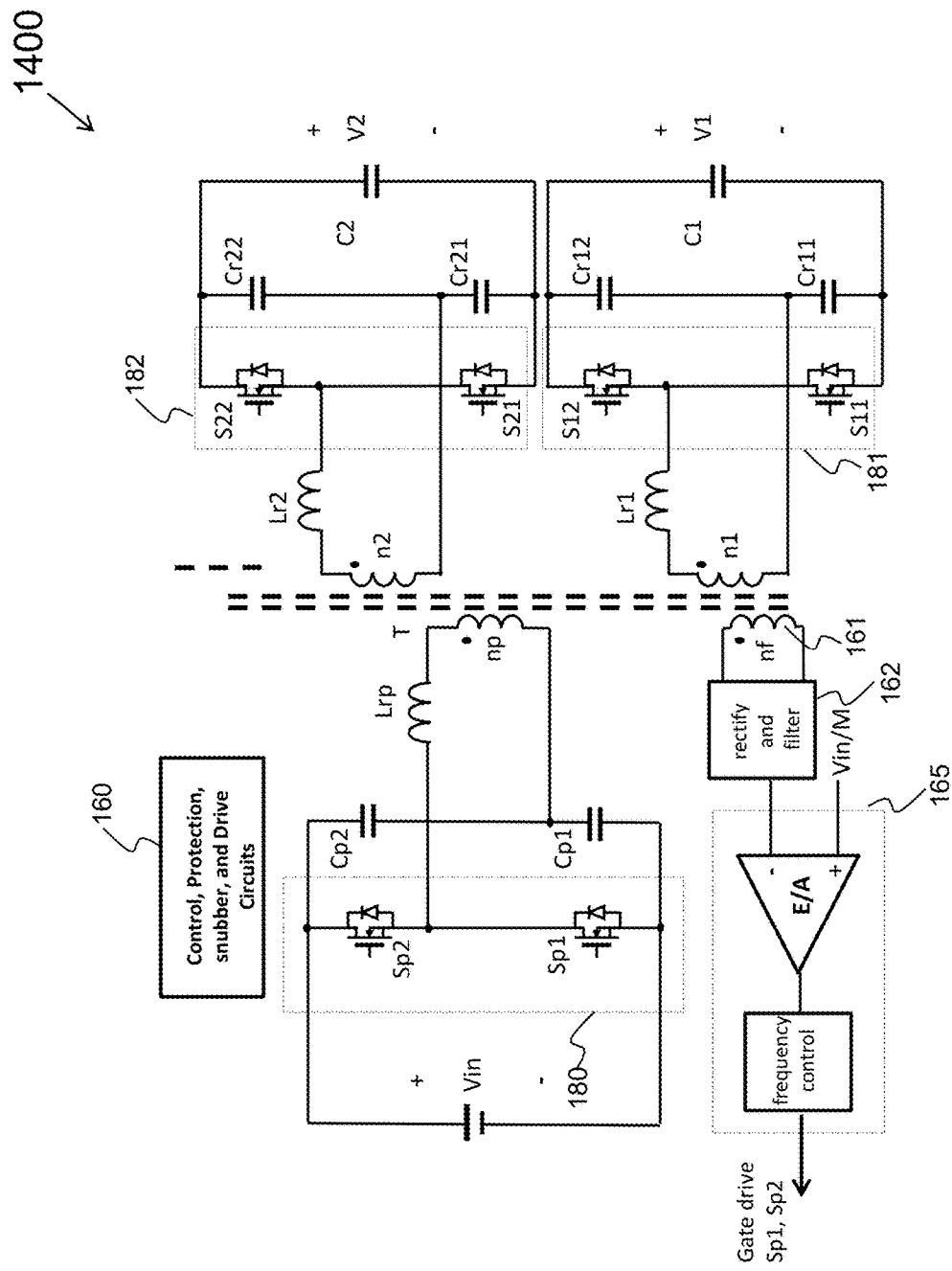
FIG. 14(a) illustrates an embodiment of a resonant power converter with automatic frequency tracking in accordance with various embodiments of the present disclosure.
FIG. 14(b) illustrates simulated waveforms of the resonant power converter in FIG. 14(a) in accordance with various embodiments of the present disclosure.

In some applications, the input voltage Vin may already be at the right value for the system, so the multi-output power supply just needs to convert the input voltage to needed multi-output format, and does not need to adjust values of its outputs. In this case the multi-output power supply behaves as a multi-output bus converter. FIG. 14(a) shows a multi-output resonant converter with local compensation suitable for such applications. Half-bridge configurations at the primary side (180) and at the secondary side (181 and 182) are shown in the figure. However, as well known in the industry, full-bridge and other suitable configurations, and any combination thereof, can also be used. Traditionally, a resonant converter such as an LLC converter has a resonant tank only at the primary side of the transformer. When such a topology is extended to multi-output configuration by adding more transformer windings, each output's voltage is affected by the leakage inductance of the secondary winding to which it is coupled. Therefore, the voltage of the each output may deviate significantly from the ideal value determined by the turns-ratio of the transformer windings, resulting in voltage inaccuracy. In the new topology of FIG. 14, each output also has a resonant tank coupled to the associated secondary winding, consisting of two resonant capacitors in half-bridge configuration (e.g. Cr11 and Cr12 for V1) and a resonant inductor (e.g. Lr1 for V1). This double-side resonance topology significantly reduces the effect of transformer leakage inductance on voltage regulation, and thus achieves better cross regulation between different outputs, and also allows the output voltage to be sensed at the primary side more accurately (from feedback winding 161, for example). The resonant inductors can be discrete parts, or the leakage inductance of the transformer windings, or any combination thereof. Series resonant tanks are shown in the figure, but other types of resonant tanks can also be used, including LLC (utilizing the magnetizing inductance of the transformer), LCC, parallel resonant, series-parallel resonant, multi-element resonant etc. However, the resonant tanks at the primary side and the secondary side should have the same configuration, and the components in the resonant tanks should have about the same equivalent values (considering the scaling factor of transformer's turns ratios). All the resonant tanks should be designed to have the same or approximately the same resonant frequency (or resonant frequencies if more than one resonant frequencies existing in a tank). If the converter's switching frequency is the same as the designed resonant frequency, and thus the leakage inductance (or any added inductance to the resonant tanks) is compensated by the associated resonant capacitors, and resonant tanks have a voltage gain of 1. Under this condition, the output voltages follow the exact relationship determined by the transformer winding turns-ratios, if the power losses of the components are ignored:

$$V2 = \frac{n2}{n1} V1,$$

where n2 and n1 are the number of turns of the secondary windings coupled to V2 and V1 respectively.

Even if the operation frequency is not exactly the same as the resonant frequency of each resonant tank due to component tolerance and other issues, the compensation effect of the resonant capacitors can still improve the performance of the power supply. The feedback winding 161 (with nf turns) picks up a reflected voltage whose amplitude is in proportion to the secondary winding voltages of the transformer. After processed by the signal conditioning block 162, the resulting feedback signal coupled to the error amplifier (E/A) is proportional to the output voltages. In one preferred embodiment, the functions performed by the block 162 include rectification and filtering, and possibly some signal conditioning to remove the effect of noise and irregularity caused by switching actions, By making the error/amplifier's reference voltage proportional to the input voltage with the right scaling factor M, all resonant tanks should have a theoretic voltage gain of close to one, so the effective voltage gain of the equivalent resonant tank representing the multi-tank system in this converter is approximately 1 in steady state. Considering the parameter tolerance in the resonant tanks, the reference, and the feedback control, the steady-state switching frequency may not be exactly the intended resonant frequency of the resonant tanks, or the same as the actual resonant frequency of any resonant tank. However, it will not deviate significantly from the intended resonant frequency if the component tolerance is not too high, for example not higher than +/−20%. This mode of operation is called controlled near resonance operation. As a result, the converter will automatically operate at a frequency very close to (for example within 10%) the resonant frequencies of all resonant tanks, achieving good efficiency and good output voltage regulation without sensing each output. Please note that in other embodiments this control scheme can work well also by sensing the output voltage directly at one of the outputs (instead of through a feedback winding), but such control system with direct sensing is more complex and expensive due to the need of signal isolation.

The existence of a closed-control loop in the controlled near resonance operation also allows the transient performance be controlled if necessary. Especially, for large transients such as startup or fault protection, a soft start or soft transition can be controlled through duty cycle or switching frequency of the converter, or through trajectory control of the resonant tank variables (the current in a resonant inductor, transformer winding or switch, the voltage across a resonant capacitor, or both).

Figure 14B:
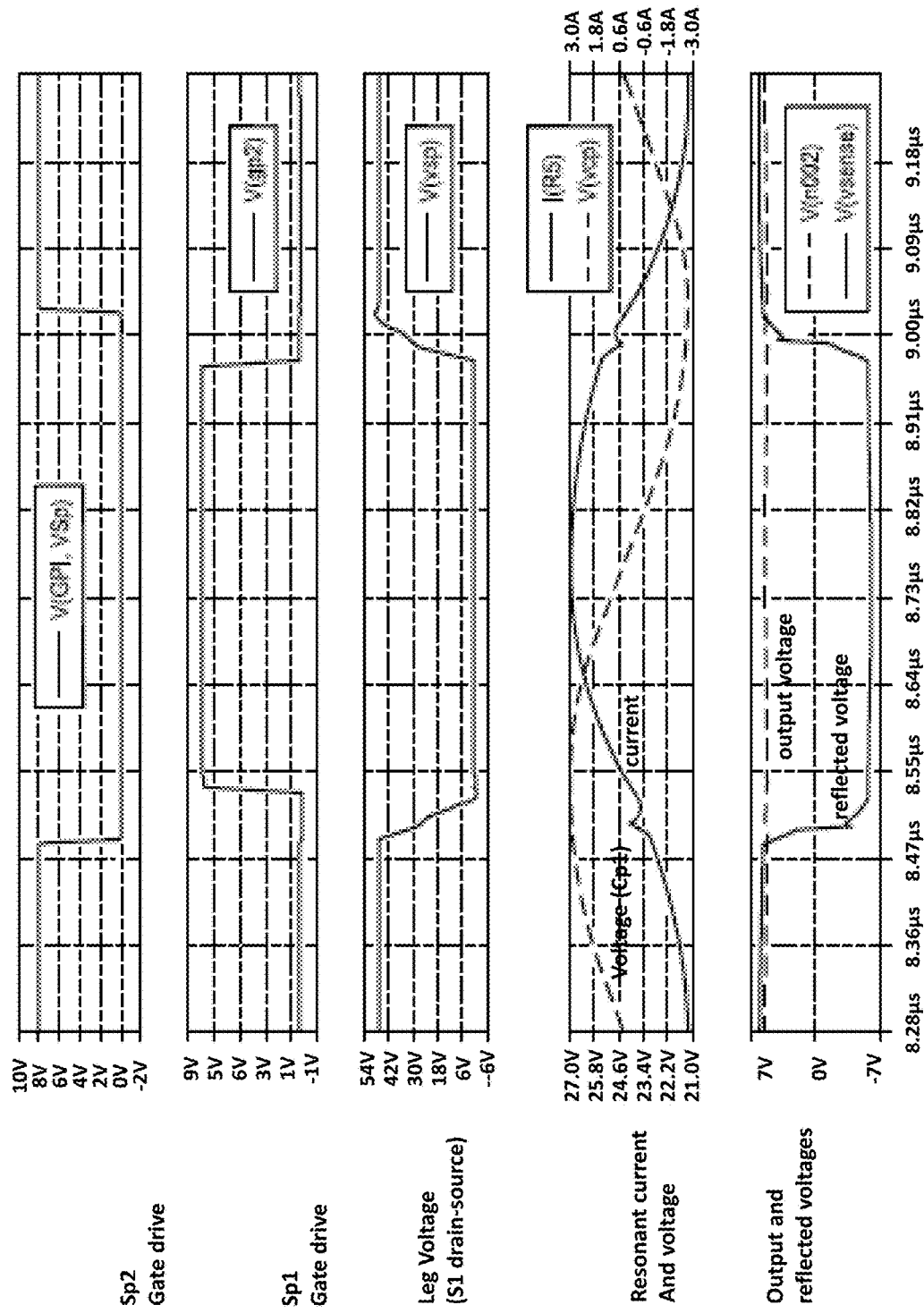

FIG. 14(b) shows the simulated waveforms of the converter in FIG. 14(a) in steady state operation. The primary switches Sp1 and Sp2 are gated on and off in complementary mode, with each having about 50% duty cycle. A short transition period is added between a switch's turn-off and the other switch's turn-on, to avoid cross conduction and allow zero-voltage turn on. It can be seen that zero voltage turn-on has been achieved for both Sp1 and Sp2. However, in other embodiments the resonant converter can be operated to achieve zero-current turn-off of Sp1 and Sp2, as is well known in the industry. Usually, to achieve zero voltage turn-on the magnetizing inductance of the transformer T is intentionally reduced. It can been seen also that the amplitude of the reflected voltage from the feedback winding nf is very close to an output voltage with same number of turns as nf. The small difference is mainly due to the power losses in the output circuit. Such deviation can be reduced if desired by considering power loss related information such as the transformer or switch current in the feedback or reference circuit of the error amplifier denoted as E/A in the regulation circuit 165. Although synchronous rectifiers S1 through S4 are shown in the secondary in FIG. 14(a), diode rectifiers can also be used to replace any or all of the synchronous rectifiers, as usual in power converters. The gate drive signals of synchronous rectifiers can be obtained from control signal in the primary through a gate drive transformer or other isolation components, or from windings on the main power transformer T, or from the current signals in the associated secondary windings or from the currents in the devices themselves. More outputs can be obtained by adding more secondary windings and associated resonant tanks and rectifier circuits.

This topology can also be used to operate away from the resonant frequency and thus achieves different voltage gains to regulating the output voltages to desired values. As long as the equivalent LC values in each resonant tank (considering the scaling factor of the transformer's turns ratios) are approximately the same, the double side resonance can achieve good cross regulation between the outputs.

Figure 15A:
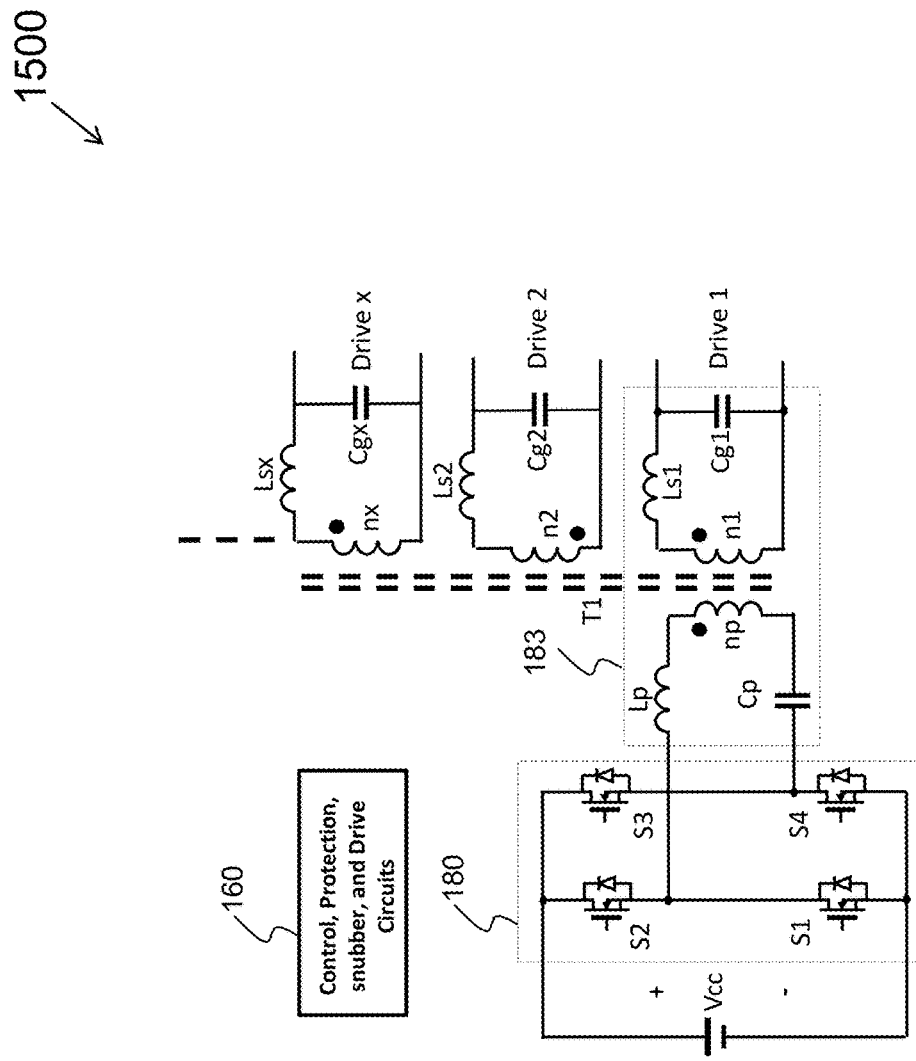
FIG. 15(a) illustrates an embodiment of a resonant gate drive in accordance with various embodiments of the present disclosure.
Figure 15B:
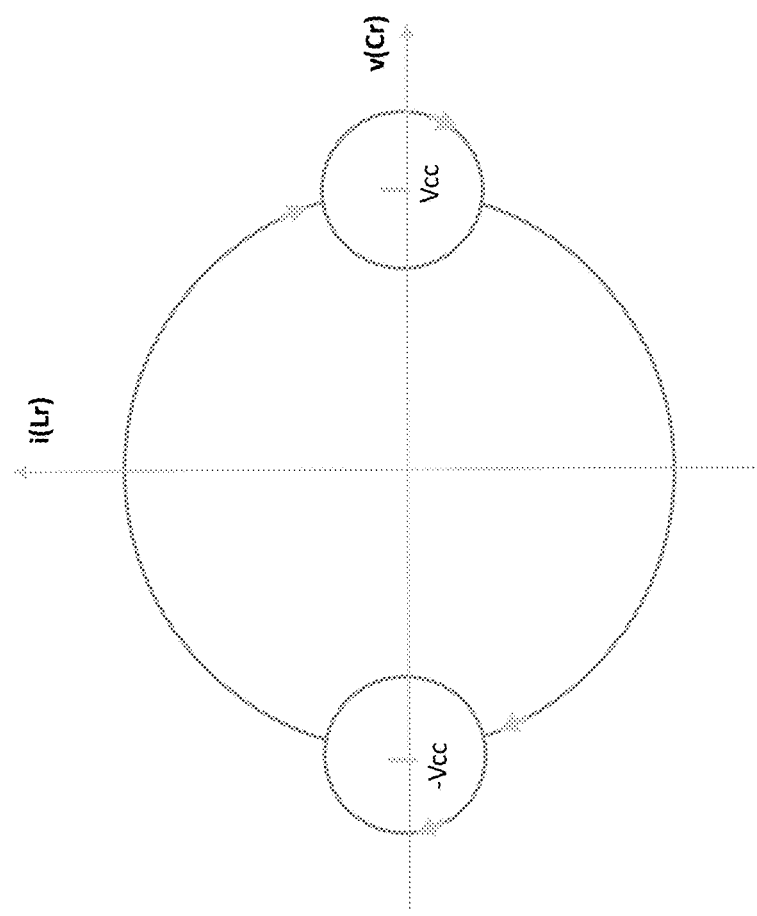
FIG. 15(b) illustrates the state-plane trajectory of the resonant gate drive in FIG. 15(a) in accordance with various embodiments of the present disclosure.

The main power switches (usually power MOSFETs) should be designed to have low gate charge, so the driving loss is not significant. This means that the gate threshold voltage of the switch and the drive voltage applied on the gate should be reduced whenever possible. If the switching frequency used is high, it may be desirable to use resonant gate drive technologies to further improve the power converter efficiency. For a converter running around resonant frequency, it's also possible to use similar timing and drive circuit of the primary power switches (in this example Sp1 and Sp2) to drive the synchronous rectifiers, making the converter design much easier. FIG. 15(a) shows an example of a resonant gate drive circuit. A bridge circuit consisting of drive switch Network 180 (S1 through S4) converts the control signal for a controller to an ac waveform. The ac waveform is fed into a resonant circuit coupled to a gate drive transformer T1. Cp in the primary winding of T1 can serve for dc-blocking, or be part of the resonant capacitance, or be used for both purposes. Lp, Ls1, Ls2, and Lsx are the resonant inductors, and each of them can be a discrete inductor, the leakage inductance of the corresponding transformer winding, or any combination thereof. Cg1, Cg2 and Cgx are the equivalent gate-source capacitance of the switches to be driven, or any additional capacitance put there, or any combination thereof. Cg1, Cg2, and Cgx are also part of the resonant capacitance. To make sure that each drive output has similar performance, it's important to make sure that each component associated with each drive winding of transformer (n1, n2, nx) has similar equivalent value to its counterpart in any other driver winding when transferred to the primary side. If different numbers of turns are used in the driving windings, then in any secondary winding circuit, the secondary inductance (Ls1, Ls2, and Lsx) should be approximately proportional to the square of the number of turns of the winding, while the capacitance should be approximately inversely proportional to the square of the number of turns of the winding. If the equivalent gate-source capacitance of any switch is different from another's, external capacitors of appropriate values can be used to make the equivalent capacitance reflected to the primary approximately the same for all drive windings. In this way, all the resonant components can be grouped into a series resonant tank of inductance Lr (including the leakage inductance of the transformer and any trace and packaging inductance) and resonant capacitance Cr. Traditionally, a resonant gate drive involves one resonant state in one direction (charging and discharging), so the gate voltage is basically sinusoidal. Issues with this kind of driving scheme is that it takes a relatively long time for a switch to change from OFF state to ON state or vice versa, and the gate drive waveform varies strongly with the variation of the inductance and capacitance values. As a result, the converter performance is compromised. To improve upon this, a new composite driving scheme can be used. FIG. 15(b) shows the concept of the composite driving technique in state plane. As is well known, a resonant tank's normalized inductor current i(Lr) and the normalized capacitance voltage moves in a circular fashion in a resonant state. With the composite driving technology, the resonant tank operates in more than one state in the charging phase and discharging phase of a switching cycle.

In FIG. 15(b) two states are shown for each direction. The first state is shown by the big arcs in the trajectory, during which the voltage applied to the resonant tank is zero, and the resonant voltage (and thus gate voltages) changes polarity, as the center of the arcs is (0, 0). This can be called the polarity reversing state. The other state is shown by the small circles, during which the drive power supply Vcc is applied to the resonant tank in positive or negative direction, so the centers of the circles are (+Vcc, 0) and (−Vcc, 0) respectively. Because the radius of the small circles is much smaller than Vcc, during second state the resonant voltage fluctuate around Vcc or −Vcc slightly, so roughly the gate voltage can be considered to be pseudo "clamped" around Vcc or −Vcc with a small ripple. This state can be called a pseudo clamped state. Because a trajectory can circle the center in second state (the pseudo clamp state) as many times as required, the gate drive voltage can stay in the pseudo "clamped" mode for a relatively long and controllable time which is terminated by the start of the polarity reversing state in the other direction.

A complete switching cycle can be divided into 4 phases. The following is an example for explanation:

Assuming at the start the drive circuit is in positive charging phase with S2 and S4 turned on (S1 and S3 are off), so the circuit is in positive pseudo clamp state. The drive outputs Drive 1 and Drive X have positive voltages around a maximum value determined by Vcc with a scaling factor associated with the winding turns ratios and the ratios of resonant capacitances. The switches coupled to Drive 1 and Drive X are turned on. The other drive output Drive 2 has a voltage around negative maximum, so the switch coupled to it is off. The drive circuit and the switches will be in this state until S2 is turned off and S1 is turned on.

After S2 is turned off and S1 is turned on, the drive circuit enters into negative polarity reversing state, and the resonant voltage and thus the gate voltages cross zero and reverse their polarities.

When the resonant capacitor voltage reaches close to −Vcc (or the current in Lr is about zero), S4 is turned off and S3 is turned on, now the drive circuit enters the negative pseudo clamp state, and the gate voltages are in pseudo clamped mode again, but the voltage polarities are versed compared to the starting point mentioned above. This state terminates until S1 is turned off and S2 is turned on.

After S1 is turned off and S2 is turned on, the resonant voltage and gate drive voltages start their journey to change polarity again in positive polarity reversing state.

When the resonant voltage V(Cr) reaches close to Vcc, S3 is turned off and S4 is turned on, the drive circuit enters into the positive pseudo "clamp" state, and the system finishes a full switching cycle.

By adjusting the relative duration of the pseudo clamp mode, the drive circuit's operation is more independent of the resonant tank parameters, and the transition time between a switch's states can be faster than in traditional control. Moreover, the duty cycle of the main switches can even be adjusted as the durations of pseudo clamp modes do not have to be equal in positive direction and negative direction. This gives better performance and freedom in the converter design. The key to this scheme is that the control timing of the drive switches S1 through S4 should be determined by comparing the resonant capacitor voltage to Vcc and −Vcc, or comparing the resonant inductor current to zero (or a small value), so this is basically a drive scheme with feedback. Please note that actual feedback signal, either the resonant capacitor voltage or the inductor current, doesn't have to be measured at the primary side of the transformer T1. As long as the proper scaling is considered (due to the transformer turns ratios and the LC component values), the feedback signal can be taken from one or more driving circuit on the secondary side of the transformer, or from one or two feedback windings on the transformer. Alternatively, the duration of the polarity reversing states can be fixed according to the resonant tank LC parameters (roughly half the resonant cycle). This is a simple open loop control, but should work reasonably well for many applications. Also, if more drives are needed, more driving windings and associated circuit can be added as this drive structure is easily expandable.

The above schemes are relatively easy to implement with modern analog and/or digital electronics. The above explanation is for steady state operation. During transients, such as during a startup, the control should be slightly modified. For example, during a startup, the switch frequency and/or duty cycle should be changed to reduce voltage and current stresses in both the drive circuit and the main power circuit. One possibility is to keep the duration of the polarity reversing state about the same as in steady state (without comparing the capacitor voltage), but gradually increase the duration of pseudo clamp states from zero to normal value in a soft-start process. Other control methods such as switching frequency control, duty cycle control, and trajectory control can also be used to limit the stress level. For fault protection, hick-up schemes with shutdown and soft-start phases can be considered.

The above circuit many have a draw back for some applications: a gate drive voltage swings to both positive and negative value symmetrically, and its dc component is zero. It may be desirable to move the gate drive voltage to more positive or more negative in certain applications, for purposes such as adjusting the dead-time between switches. FIG. 15 (c) shows an implementation with voltage shifting and voltage clamping techniques. Diodes D1 and D2 create a positive dc voltage for Drive 1 and Drive 2, so the voltage waveforms will be shifted up for both drive outputs. If a negative bias is desired in any output, the polarity of the associate diode can be reversed. The optional resistors R1 and R2 are used to discharge the gate voltages. By adjusting the values of Cs1 and Cg1, the waveform of Drive 1 voltage can be shifted up and down. Similarly, the voltage of Drive 2 can be shifted by the values of Cs2 and Cg2. The switch Sg3 clamps the negative voltage of Drive 3 to about zero. When the clamp switch is turned on, the resonant capacitor it clamps is shorted, and totally resonant capacitance of the resonant tank is changed. As a result, the voltage waveform may be changed. The capacitances of Cs3 and Cg3 and the number of turns of winding n3 can be optimized so the effect of this capacitance change is reduced. As an alternative, if needed another clamp switch can be put in parallel with Cs3, with its gate connected at the drain of Sg3. With the symmetric connection of these two switches, if Cs3 and Cg3 have the same capacitance, then the equivalent capacitance in the resonant tank doesn't see much change during the different phases of operation, and thus the gate voltage waveform is more consistent. Such a symmetric arrangement of clamp switches is shown with the circuit coupled to winding nx. The driving winding nx in this figure powers two drive outputs coupled together. These two outputs have reverse polarities, and can be used to drive for example two bottom switches in a bridge configuration or the power switches in a push-pull configuration. The optional clamp switches Sgx1 and Sgx2 can clamp the negative gate voltages to zero if needed. As the clamp switches is turned on alternatively, the resonance of this resonant tank is not affected much by the voltage clamp. More drive outputs can be added by repeating the circuit patterns in FIG. 15(c), and the voltage shifting and voltage clamping techniques shown in the figure can be used in any combination as needed.

Figure 15C:
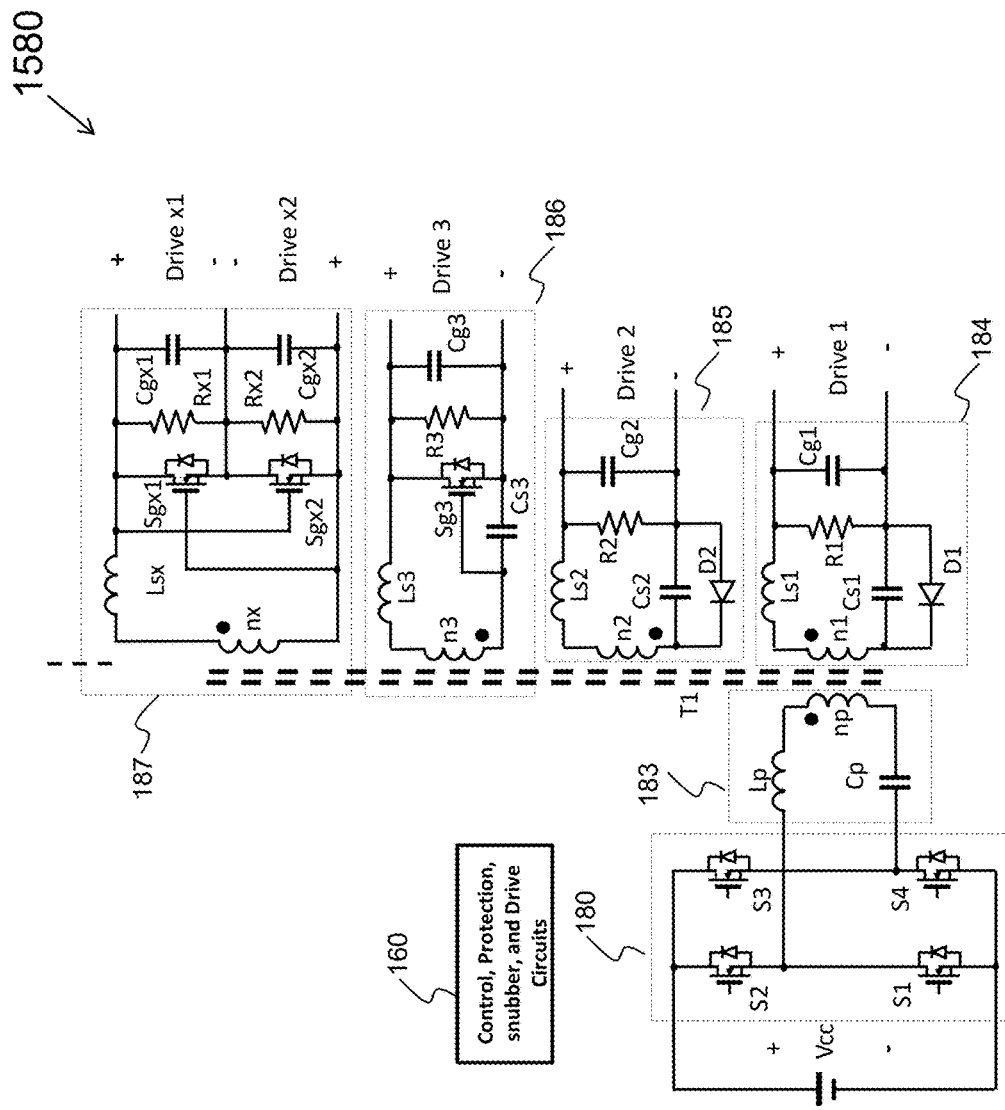
FIG. 15(c) illustrates an embodiment of a resonant gate drive with gate voltage shifting in accordance with various embodiments of the present disclosure.
Figure 15D:
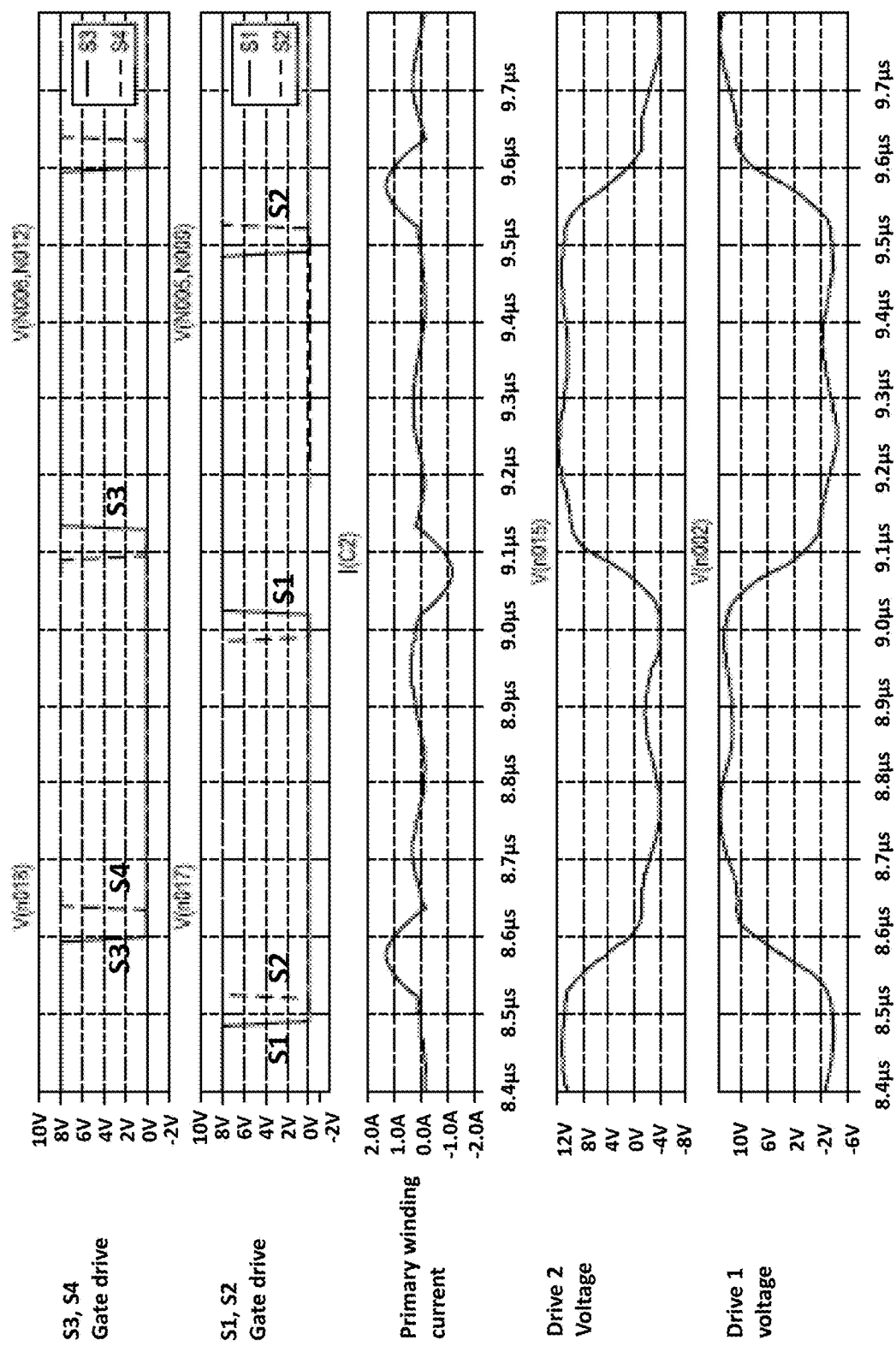
FIG. 15(d) illustrates simulated waveforms of the resonant gate drive in FIG. 15(c) in accordance with various embodiments of the present disclosure.

FIG. 15(d) shows key simulated waveforms of the circuit shown in FIG. 15(c), and verifies the operation principles discussed above.

The above discussed gate drive technologies can be used to drive power switches and synchronous rectifiers in different topologies. The controller can take the feedback information of resonant capacitor voltage or transformer current to accomplish closed-loop driving, or use a configurable delay corresponding to the polarity reverse state to accomplish open loop driving.

Figure 16:
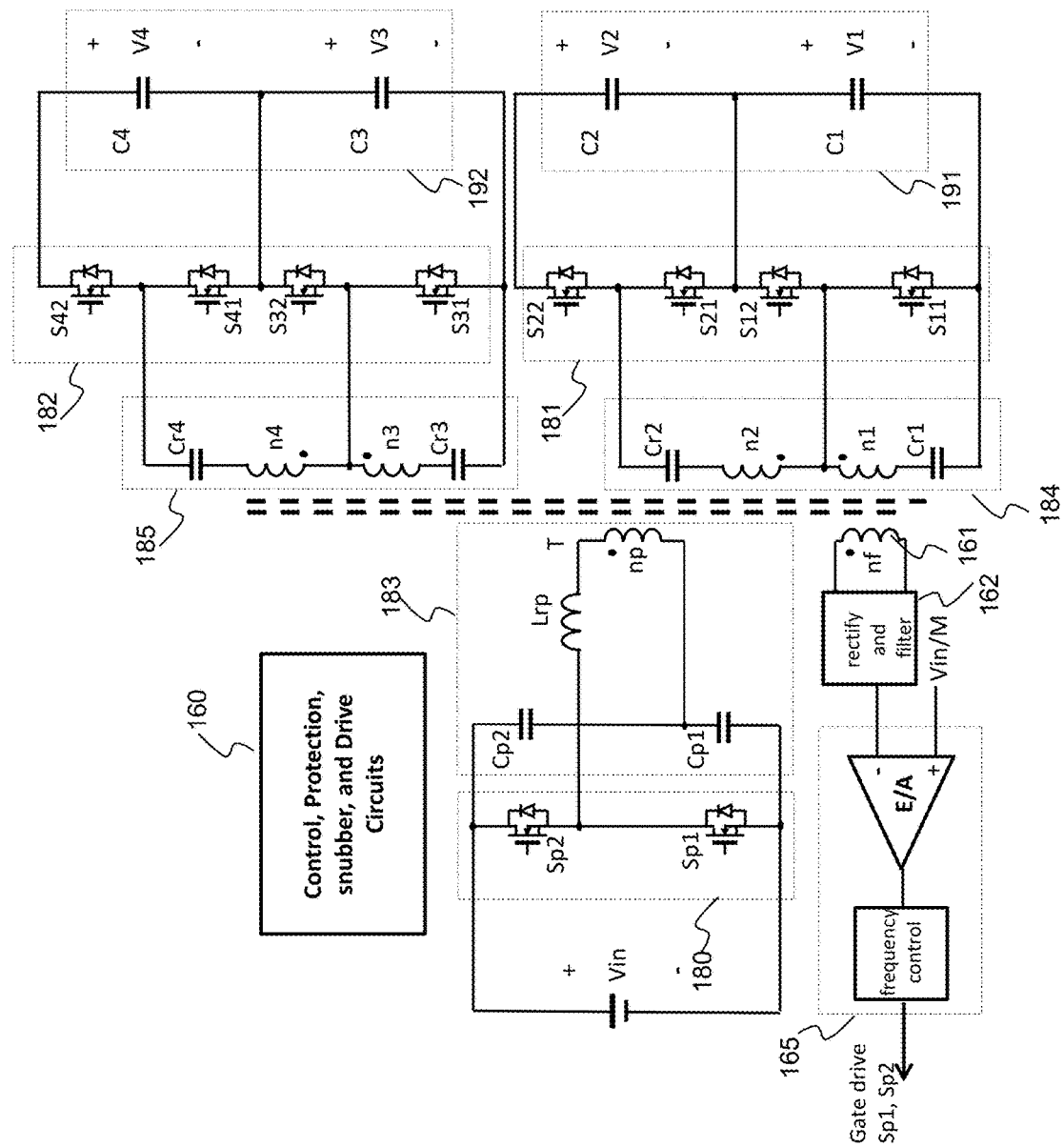
FIG. 16 illustrates an embodiment of a resonant power converter with outputs arranged in pairs in accordance with various embodiments of the present disclosure.

The topology in FIG. 14(a) uses one driving winding for each output voltage. To simplify the implementation, the output voltages may be combined into voltage pairs as needed by a power synthesizer. FIG. 16 shows a practical implementation. Now the resonant capacitors in the secondary side of the transformer Cr1, Cr2, cr3 and Cr4 are arranged to be in series with the secondary windings, and will resonate with the leakage inductance of their respective secondary windings. Since the leakage inductance of a secondary winding is proportional to the square of the number of turns of the winding, the resonant capacitance coupled to each winding should have a reciprocal relationship to the square of the number of turns of the winding so that all the resonant tanks can resonate at the same frequency, i.e.:

$$Cr2 \approx \frac{n1^2}{n2^2}Cr1; Cr3 \approx \frac{n2^2}{n3^2}Cr2; Cr4 \approx \frac{n3^2}{n4^2}Cr3;$$

If needed, discrete resonant inductors can be put in series with the transformer windings, and the value of resonant capacitors should be adjusted accordingly.

To simplify the transformer structure, the secondary windings in each voltage pair circuit is connected together: n2 is connected with n1, while n4 is connected with n3. Please note that the polarity of n2 is reverse to n1's polarity, and the polarity of n4 is reverse to n3's. This reverse arrangement of windings allows the rectifiers (synchronous rectifiers or diodes) to be connected together in a dual totem network 181 and 182, as is shown in FIG. 16. The outputs are arranged in asymmetric pairs 191 and 192. With this arrangement, when Sp1 conducts, synchronous rectifiers S11, S22, S31 and S42 should be gated on. When Sp2 conducts, synchronous rectifiers S12, S21, S32, and S41 should be gated on. Because now the top winding in a voltage pair circuit charges both output voltages in the pair, to maintain a doubling relationship between the output voltages in the pair, the top winding should have three times the number of turns as the bottom winding: n2=3*n1, n3=4*n1, n4=3*n3.

The doubling relationship of output voltages can also be realized with simpler winding structure by duty cycle control. In the half-bridge topology shown in FIG. 17(a), multiple windings are coupled to the same magnetic component (transformer T1 in this case), where there exists a relationship between the numbers of turns in the windings: n3=4*n2. Sp1 and Sp2 are controlled in complementary mode but with different duty cycles. The duty cycle of Sp1, D1, is twice the duty cycle of Sp2, D2: D1=2*D2. If the short transition periods in which both switches are off are ignored, then we have: D1≈⅔ and D2≈⅓. Then by virtue of volts-second balance of the magnetic component T1, the output voltages in steady state have a doubling relationship:

$$V1 = Vin * \frac{n2}{3*n1}; V2 = 2*V1; V3 = 4*V1, V4 = 8*V1$$

In this way, one secondary winding is used to produce a pair of outputs. In one embodiment, the two output voltages are different in a pair. In other embodiments the two voltages can be made to have a different relationship by adjusting D1 and D2 differently. The synchronous rectifiers S1 through S4 can be replaced by diodes if needed. The gate drive signals for the synchronous rectifiers can be in synch with the primary switches, or emulate ideal diodes: gated on when the body diode starts conducting, and gated off when the current through it is lower than a threshold value. The drive signals can be obtained from primary control signal or through transformer windings of T1, or through current signals in the transformer windings or the switches. As an option, the above discussed composite resonant driving technology can also be used, as the durations of the pseudo clamp state can be set to different values during Sp1 conducting phase and Sp2 conducting phases.

In practice, closed-loop control may be required to maintain the voltage relationship. A possibility is to use voltages in the primary side, such as capacitor voltages or a winding voltage to simplify the control cost. For example, when the voltage of Cp1 is less than 50% of the voltage across Cp2 (or less than ⅓ of the dc-link voltage across the half-bridge configuration of Sp1 and Sp2), then the duty cycle of Sp1 (D1) should be adjusted lower. When the voltage of Cp1 is higher than 50% of the voltage across Cp2, then the duty cycle of Sp1 (D1) should be adjusted higher. A feedback controller can automatically adjust the duty cycle to the right value.

Figure 17A:
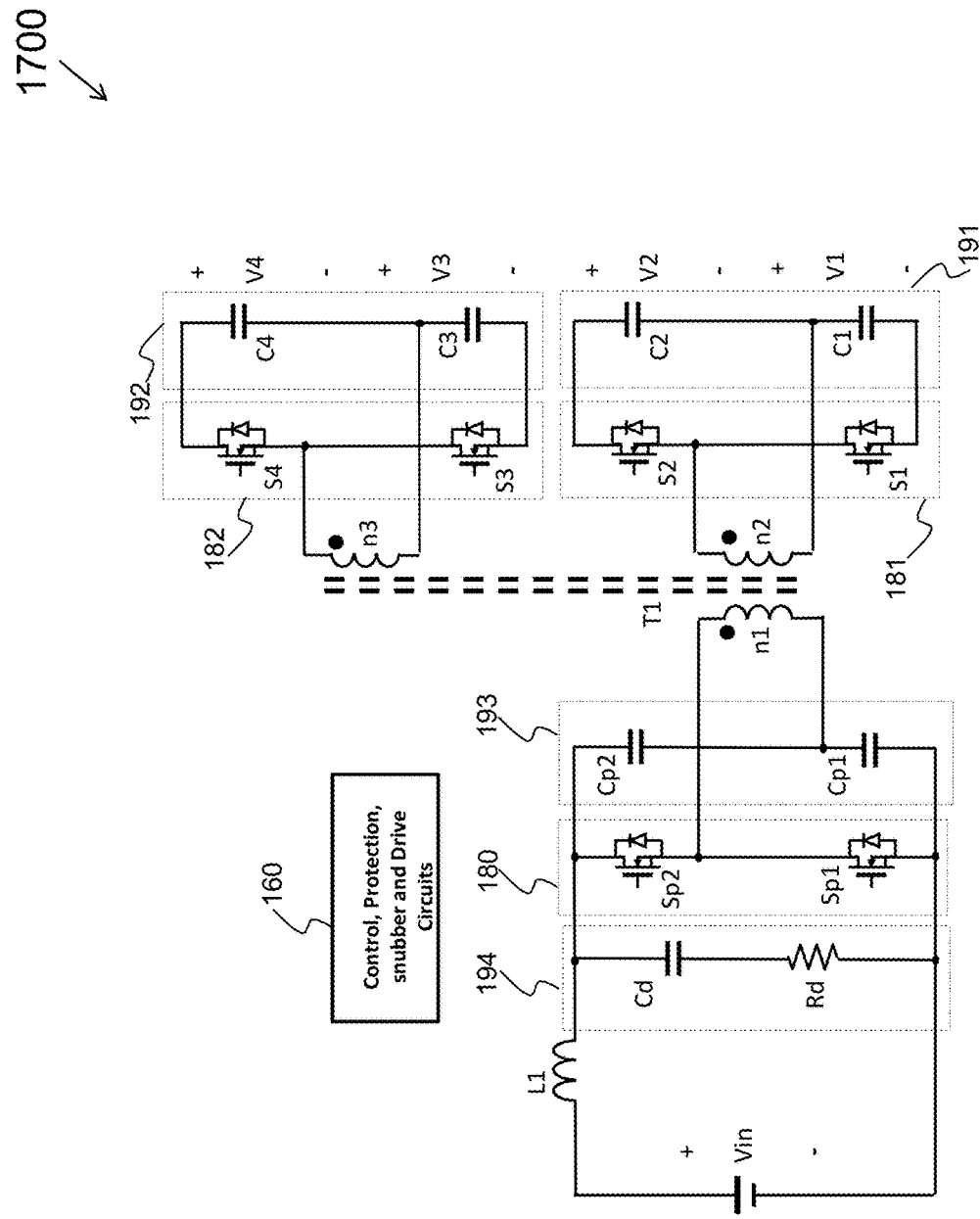
FIG. 17(a) illustrates an embodiment of a current-fed power converter in accordance with various embodiments of the present disclosure.
Figure 17B:
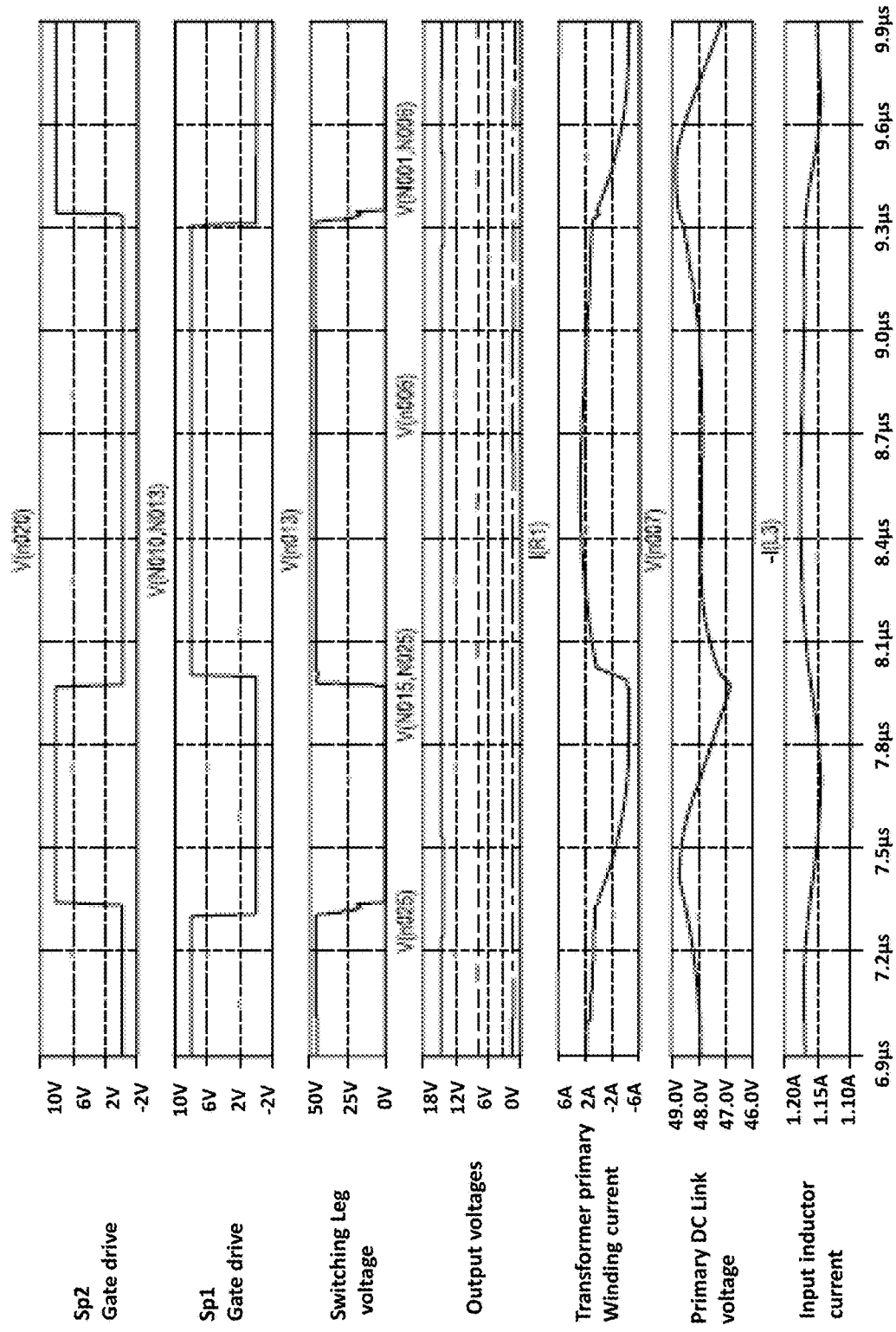
FIG. 17(b) illustrates simulated waveforms of the power converter in FIG. 17(a) in accordance with various embodiments of the present disclosure.

Due to current-fed nature of this topology caused by the input inductor L1, a snubber circuit or clamp circuit may be used to reduce the voltage stress of primary switches. In FIG. 17(a) an optional passive snubber consisting of Cd and Rd is inserted across the dc link and between the input inductor L1 and the switches. Other types of snubber or clamp circuits can also be used. FIG. 17(b) shows simulated waveforms of this topology. It can be seen that Sp1 is turned on with reduced voltage, and Sp2 is turned on with zero voltage. The ability to achieve soft-switching in this topology improves its efficiency.

Figure 18:
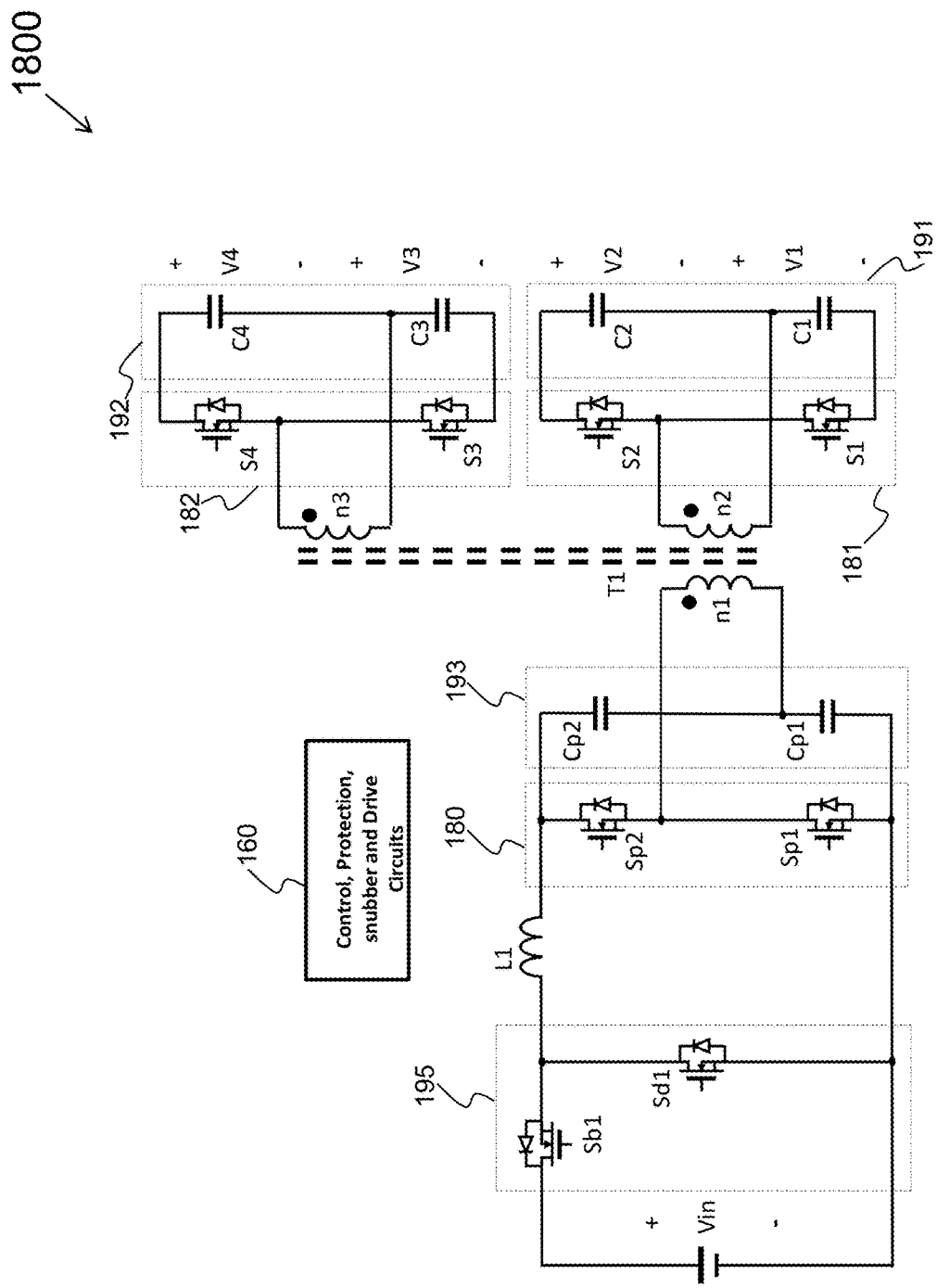
FIG. 18 illustrates an embodiment of a multi-output power supply with voltage regulation in accordance with various embodiments of the present disclosure.

The topology in FIG. 17(a) has limited ability to adjust the output values by adjusting the duty cycles of the switches. If a wide range of adjustment is needed, a regulation stage can be added at the input. FIG. 18 shows a buck regulation stage 195 consisting of buck switch Sb1 and synchronous rectifier Sd1 is added. The switching of Sb1 can be synchronized with Sp1 and Sp2, or can be arranged independently.

Figure 19:
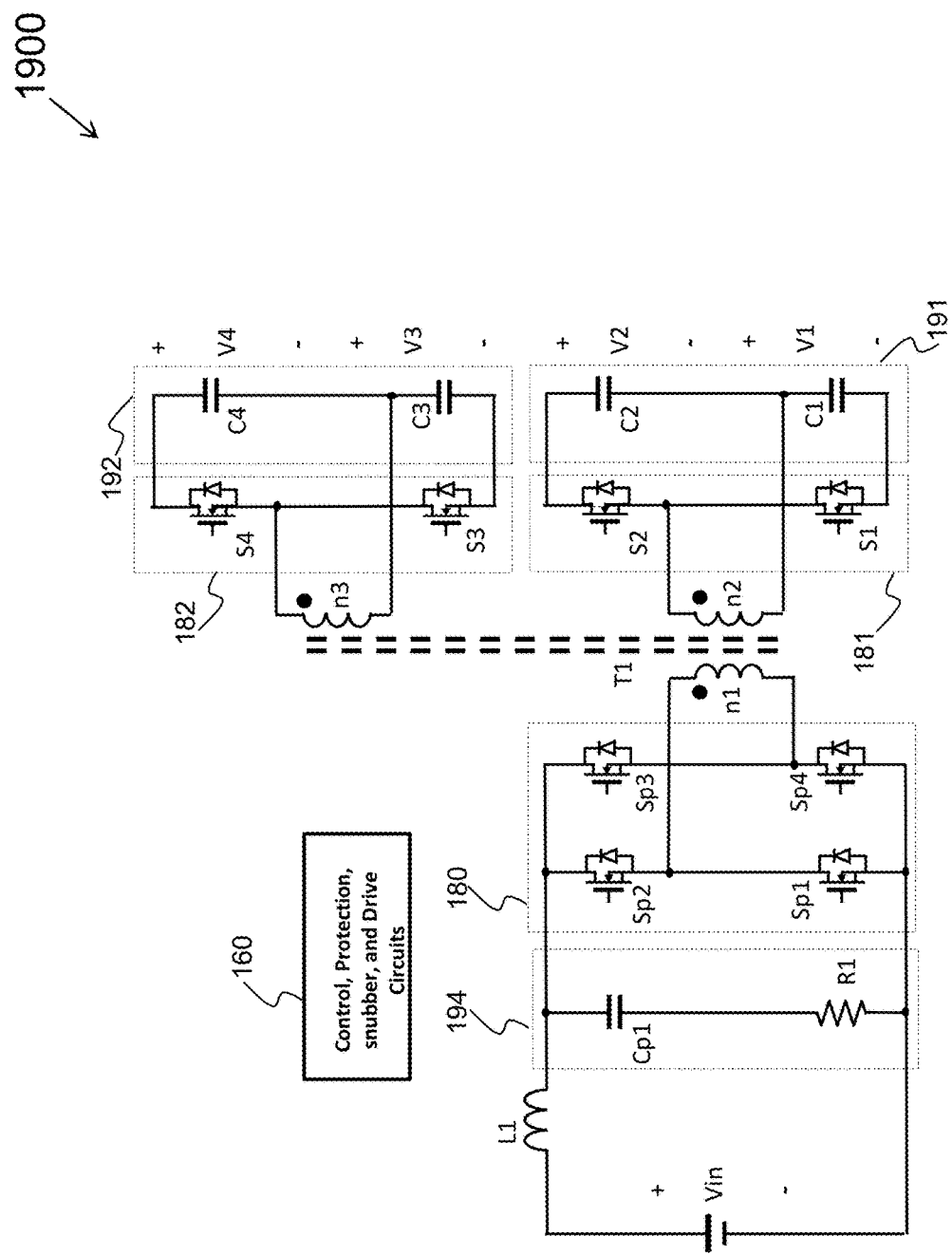
FIG. 19 illustrates an embodiment of a multi-output current-fed full bridge power converter in accordance with various embodiments of the present disclosure.

Different implementations can be obtained by changing the half-bridge configuration in FIG. 17(a) to different topologies. A full-bridge configuration using the same duty cycle control principle is shown in FIG. 19 which can two pairs of outputs. The secondary windings also have a quadruple relationship between the number of turns: n3=4*n2. The primary switch network consisting of four primary switches Sp1 through Sp4 are operated in 3 states alternatively:

State 1: Sp1 and Sp3 are turned on, and Sp2 and Sp4 are turned off. Secondary side synchronous rectifiers S1 and S3 conducts, and S2 and S4 are gated off. The transformer winding voltages are determined by V1 and V3;

State 2: Sp1 and Sp3 are turned off, and Sp2 and Sp4 are turned on. Secondary side synchronous rectifiers S1 and S3 are gated off, and S2 and S4 are gated on. The transformer winding voltages are determined by V2 and V4;

State 3: all primary switches Sp1 through Sp4 are turned on (or at least switches in one of the two legs, i.e. Sp1 and Sp2 or Sp3 and Sp4, are turned on), all secondary synchronous rectifiers S1 through S4 are gated off. The transformer winding voltages are zero.

In a switching cycle these states may have different sequences, but a preferred sequence is that an active state (State 1 or State 2) is followed by a zero state (State 3), and then the other active state (State 2 or State 1), and then a zero state (State 3). The duty cycle of State 1 (D1), should be kept at twice the duty cycle of State 2 (D2): D1=2*D2. The remaining duty cycle D3=1−D1−D2 is the duty cycle of zero state S3, and should be split into two parts to be inserted between D1 and D2. In steady state, the ideal output voltages are:

$$V1 = \frac{Vin}{2D1}\frac{n2}{n1}, V2 = 2V1, V3 = 4V1, V4 = 8V1$$

Therefore, by controlling D1, the output voltages can be adjusted to the desired value. This control can be implemented as a current mode or voltage mode closed-loop control if precise regulation is required.

To maintain the doubling relationship between V2 and V1, another closed-loop control may be used to adjust the relative value of V2. If V2 is higher than the ideal value (2*V1), D2 should be increased. If V2 is lower than the ideal value, D2 should be reduced.

If the duty cycle of State 3 (zero state) is intentionally kept close to zero, then this converter becomes a multi-output bus converter, which may have high efficiency.

Because the primary side switches are not clamped, there may be high voltage stress during a switch's turn-off. Proper measures, such as a snubber or an active clamp circuit can be used to reduce the voltage stress. In FIG. 19, a snubber/clamp circuit 194 is shown. In a preferred embodiment, the circuit 194 may be a passive snubber consisting of a capacitor and a resistor. In another embodiment, the circuit 194 may have one or more active clamps.

Figure 20:
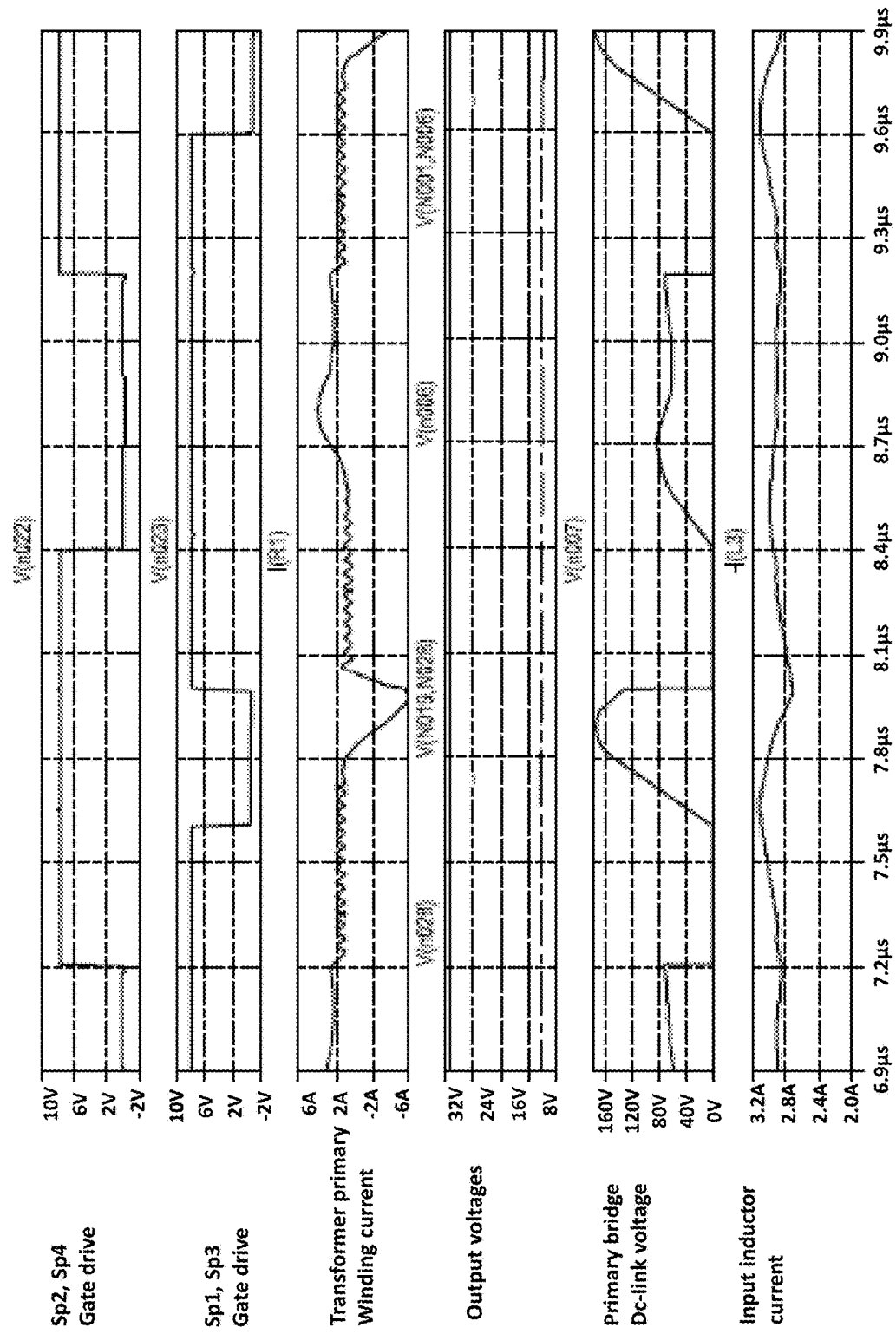
FIG. 20 illustrates simulated waveforms of the power converter in FIG. 19 in accordance with various embodiments of the present disclosure.

FIG. 20 shows the simulated key waveforms of the converter shown in FIG. 19 in an example implementation, and verifies the operation principle discussed above. Although doubling relationship is shown in this embodiment for the voltages in a pair, other relationships are possible by changing the relationship between D1 and D2. If D1=D2, then the two voltages in pair 191 or 192 will be equal.

Figure 21A:
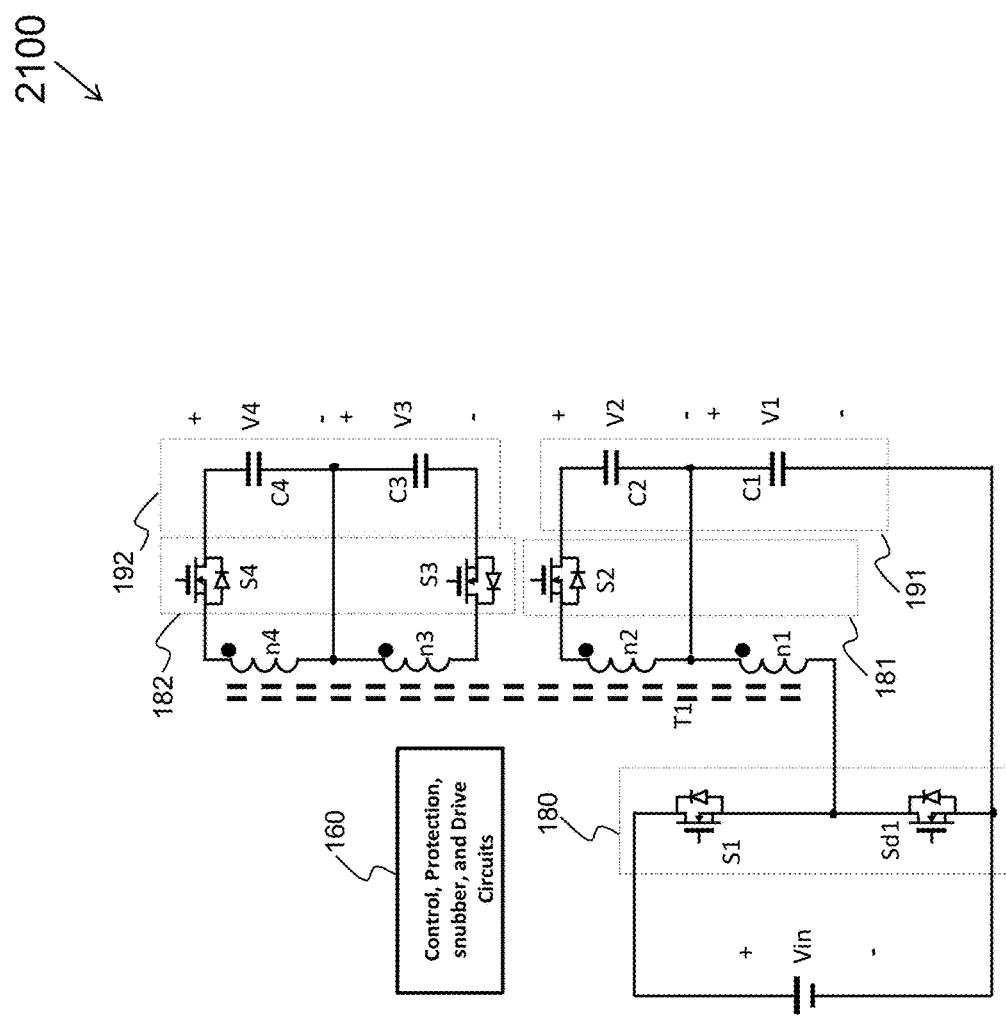
FIG. 21(a) illustrates embodiments of a multi-output power converter based on a buck topology in accordance with various embodiments of the present disclosure.
Figure 21B:
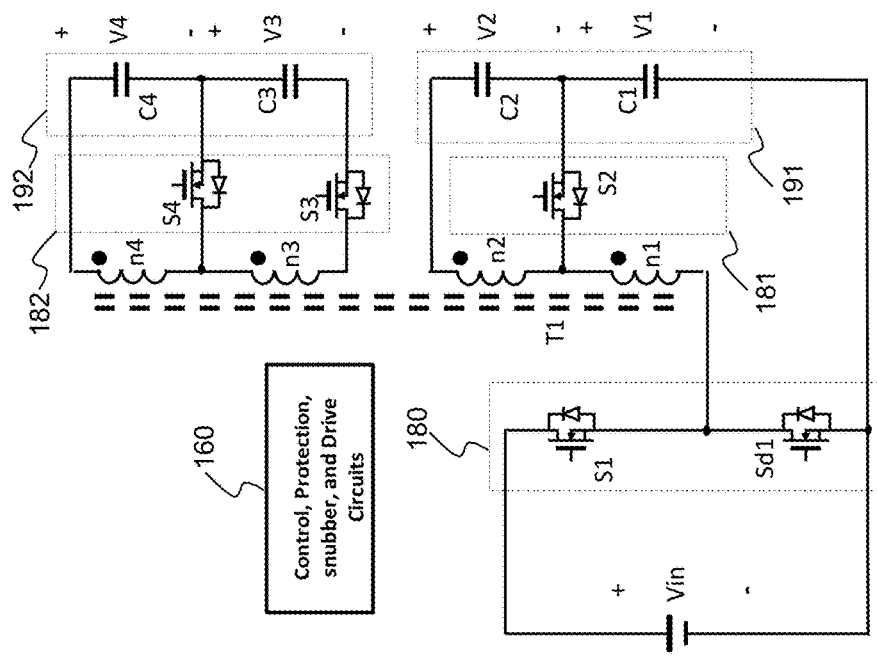
FIG. 21(b) illustrates embodiments of a multi-output power converter based on a buck topology in accordance with various embodiments of the present disclosure.

In some power applications such as smart phones and other mobile devices, there is no isolation needed between the input and the outputs of the power supply. Then a buck converter based multi-output configuration, with similar principles as discussed before, can be used to generate the input voltages for the power synthesizer. FIG. 21 shows two more examples. In FIG. 21(a), flyback windings n2, n3 and n4 are added to the magnetic component (inductor T1), and S2 through S4 work as synchronous rectifiers (in rectifier networks 181 and 182). When S1 conducts (S1d is gated off) in the buck switch network 180, switches in the rectifier networks 181 and 182 (S2 through S4) are gated off. When Sd1 conducts (S1 is turned off) in the freewheeling mode of the buck converter, S2 through S4 are gated on so power is transferred from V1 to V2 through V4, and the relationship between the output voltages is determined by the turns-ratios of the windings. The circuit in FIG. 21(b) works similarly to the circuit in FIG. 21(a), but the rectifier networks 182 and 181 are arranged slightly differently.

Figure 22:
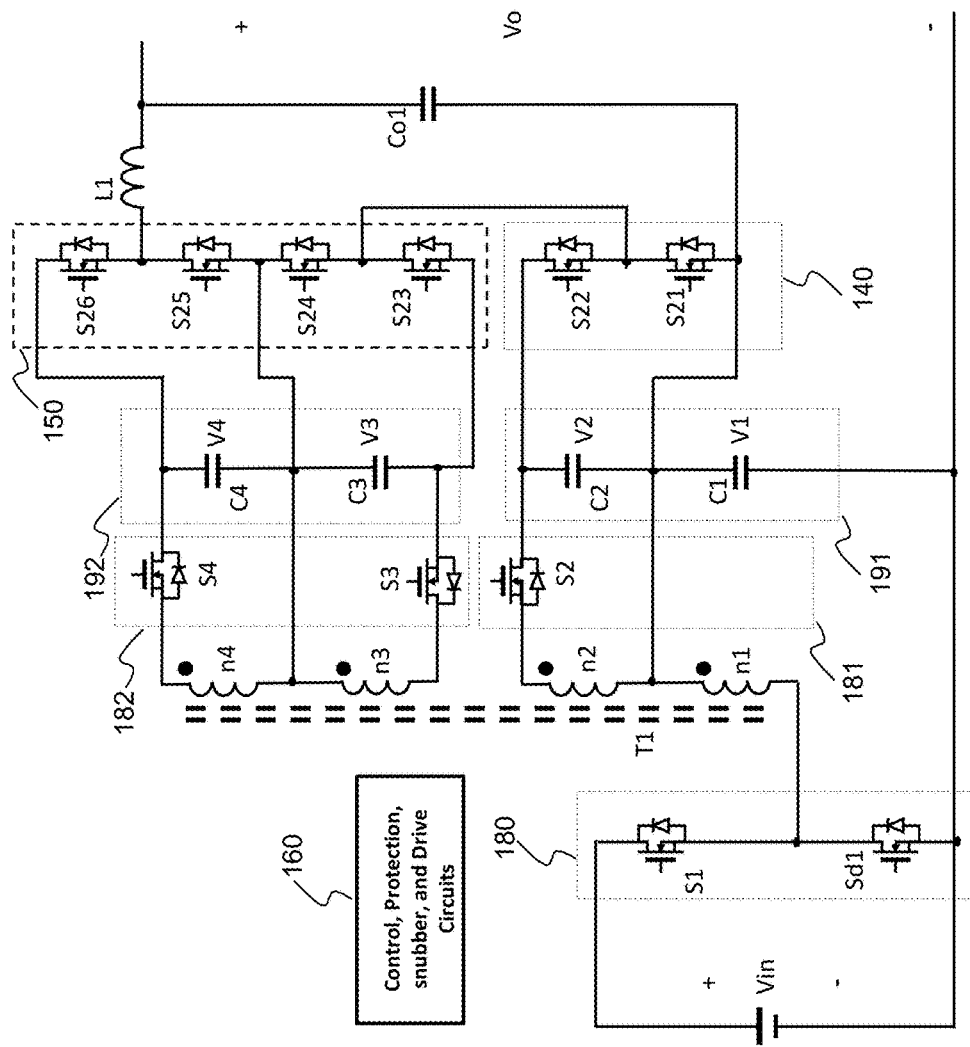
FIG. 22 illustrates an embodiment of a dynamic power supply based on a buck topology in accordance with various embodiments of the present disclosure.

The power synthesizer described above has a minimum voltage of zero. If the power amplifier needs a higher minimum voltage, another voltage source can be added to the power synthesizer. FIG. 22 shows an example of a fast dynamic power supply based on a buck-based topology. V1 is the minimum voltage applied to the PA and is generated by the buck switch cell 180 directly. Through using windings n2, n3 and n4 with proper number of turns, V2, V3 and V4 can have the correct voltages, and are fed into an eight-level power synthesizer consisting of a two-level cell 140 and 1 four-level cell 150. With this arrangement, eight different voltage levels can be achieved.

Please note that in all the above descriptions, the input power source Vin can be a primary power supply such as a battery pack, a battery plant, a photovoltaic cell, a fuel cell, or the output of a power converter such as a dc-dc converter, or an ac-dc converter. When a dc-dc converter or an ac-dc converter is used, the input voltage Vin can be dynamically adjusted. The input voltages to the power synthesizer (V1, V2, and so on) can be adjusted dynamically through changing Vin or controlling the switches in the multi-output power supply to optimize the performance (such as the efficiency) of the whole system. For example, when the system transfer power is increased due to heavier usage of users in a base station, the voltages can be increased. When the needed transfer power is reduced, the voltages can be decreased accordingly. For ET systems, the output voltages of the power supply can be controlled with a relatively slow voltage control loop (compared to the frequency of power synthesizer, or the envelope spectrum of the signal processed by the power amplifier) and follow the envelope peaks which are related to the peak or average power of the power amplifier's output over a duration of time, and change relatively slowly. Such a system is sometimes called average mode ET control.

Please note also that although in this disclosure multi outputs are used to describe the power supply topologies and control schemes, the concepts and principles can also be used for single output converters with straightforward modification (such as remove unused secondary windings and their associated circuitry). Of course, single-output power supply may not need the double-side resonance technique if the output voltage is sensed directly at the output. However, sensing the output voltage through a feedback winding at the primary side can still work well with double-side resonance technique even for the single-output applications, and using the feedback control to automatically operate a resonant converter at or near its resonant frequency is still a very effective technique for single-output converters.

Figure 23:
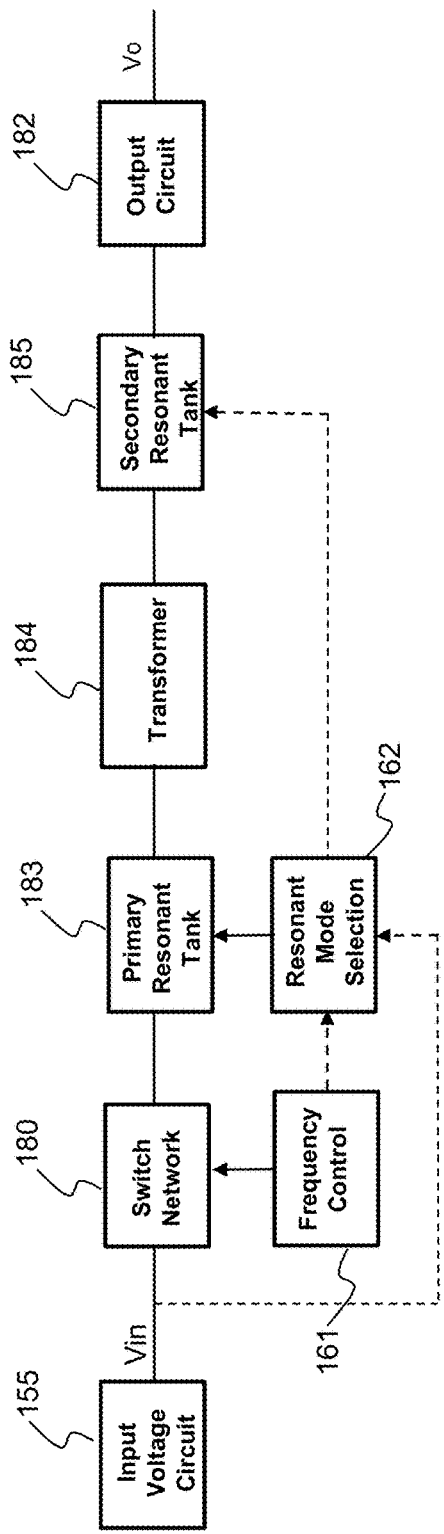
FIG. 23 illustrates an embodiment of a block diagram of a resonant power supply in accordance with various embodiments of the present disclosure.

One aspect to improve the performance of a power converter is to limit the range of the switching frequency. This is very important especially in resonant power converters and resonant power supplies. FIG. 23 shows a technique to accomplish this purpose. In an embodiment of a resonant power converter, an input voltage circuit 155 generates an input voltage Vin. The circuit 155 may be an acdc power converter connected to an ac power source, or a power terminal or power bus to bring in an external dc source. Vin may vary in a wide range due to various reasons, such as the voltage ripple in the output voltage of an acdc converter or diode rectifier. A switch network 180 converts Vin into an ac or pulse waveform, which is fed into a primary resonant tank 183. Optional transformer and secondary resonant tank 185 are coupled to the primary resonant tank 183 and output circuit 182, which generates one or more output voltages or currents. A frequency control block 161 controls the frequency of the switch network 180, and thus controls the operation of the resonant power converter 1800 and may regulate its output voltage, current or power. Resonant tanks 183 and/or 185 may have more than one resonant modes. For example, one of a resonant capacitor or inductor in a resonant tank may be variable and take different values, so that the resonant frequency and/or characteristic impedance of the resonant tank can change in a certain range, creating different resonant modes with different operating characteristics in the operation of the resonant power converter. A resonant mode selection circuit 162 is used to select a resonant mode according to the operating conditions and requirements. For example, one objective of the resonant mode selection block 162 may be to limit the switching frequency range of the resonant power converter so its design can be optimized. To do this, block 162 may use the input voltage as an input to choose a suitable resonant mode for a given range of input voltage. If the input voltage moves out of this range then a different resonant mode is chosen which is more suitable for the changed input voltage. Alternatively, block 162 may use information from the frequency control block 161 as an input. When the frequency control requires the switching frequency of the resonant power converter to enter a undesired range (for example, to go higher than a upper limit or lower than a lower limit), the resonant mode selection block 162 changes the resonant mode so the switching frequency will remain in the desired range. In this way, even if Vin may change in a wide range due to a line-frequency ripple or other reasons, or an operating characteristics may change in a wide range which may cause the switching frequency to change in a wide range, by switching among different resonant modes properly the resonant mode selection block 162 can maintain the operating of the resonant converter within a narrower switching frequency range, which may result in lower cost design and/or better performance of the resonant converter. Of course, the resonant mode selection block 162 may have other objectives, such as to increase the efficiency of the resonant power converter. This switched resonant mode operation can be implemented in primary resonant tank 183, secondary resonant tank 185, or both.

Figure 24:
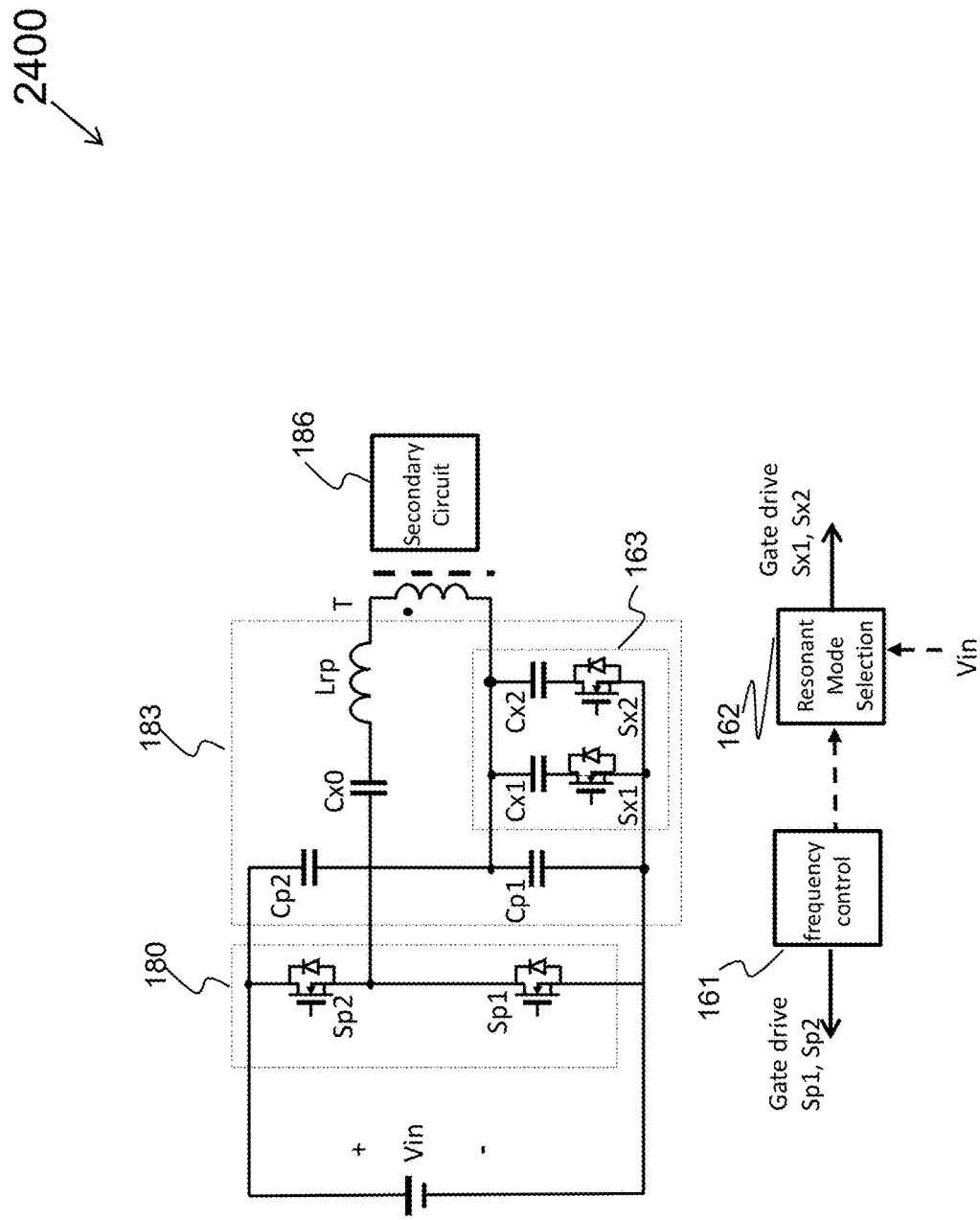
FIG. 24 illustrates an embodiment of a half-bridge resonant power converter in accordance with various embodiments of the present disclosure.

FIG. 24 shows an example to implement the technique of switched resonant mode described above. Sp1 and sp2 form a half-bridge switch network 180. Secondary circuit 186 is not shown in detail for the sake of brevity, and may consist of any suitable circuit to produce one or more suitable outputs. Lrp, which may include the leakage inductance of transformer T, is a resonant inductor. Cx0, Cp1 and Cp2, as well as the switchable capacitor network 163 consisting of Cx1, Cx2, Sx1 and Sx2, form equivalently a resonant capacitor. By controlling the ON/OFF states of Sx1 and Sx2, four different capacitances, including 0, Cx1, Cx2, and Cx1+Cx2, can be put into parallel with Cx0, resulting in 4 different resonant capacitances for the resonant tank 183. This is equivalent to change the capacitance of the equivalent resonant capacitor. In this way, 4 resonant modes are generated, and can be switched by resonant mode selection block 162.

Figure 25:
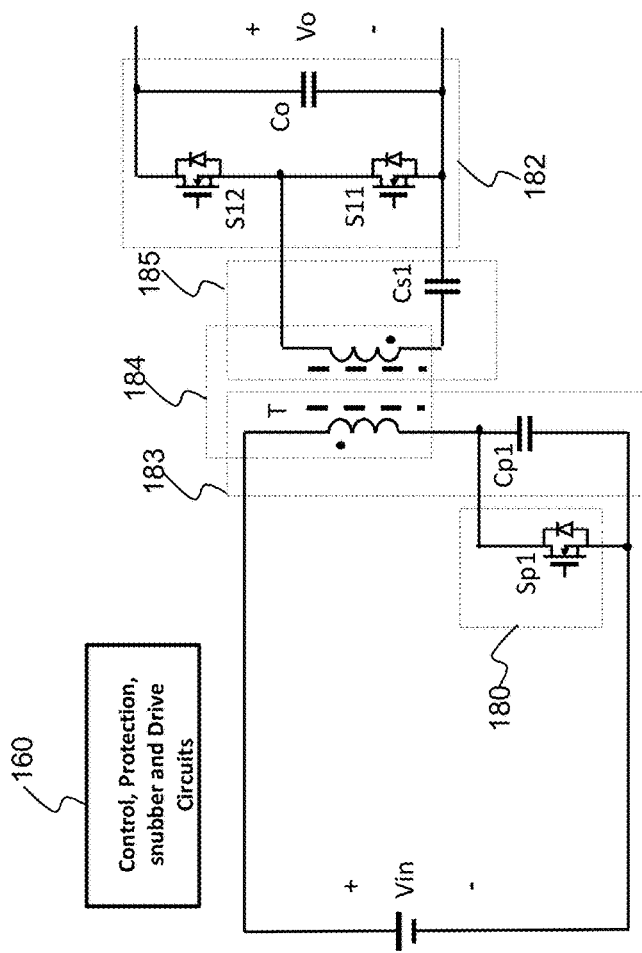
FIG. 25 illustrates an embodiment of a flyback resonant power converter in accordance with various embodiments of the present disclosure.

In low power application, a single-end topology such as a flyback, forward, or class-E resonant converter may be more desired due to lower implementation cost. FIG. 25 shows a single-end resonant topology which is a hybrid of a flyback converter and a class-E converter. Sp1 forms a primary switch network 180, Cp1 and the primary winding of transformer T (184) form a primary switch network 183, Cs1 and a secondary winding of transformer T form a secondary resonant tank 185. Cp1 may include the output capacitance of power switch Sp1. The transformer T may be implemented on a PCB (printed circuit board) or multiple PCBs to have relatively consistent magnetizing inductance and leakage inductance. Multiple PCBs may be separated to increase safety distance or for other system consideration. Of course, separate inductors may be added to the primary winding or secondary winding of the transformer, and different resonant tank configurations, such as a parallel resonant or parallel-series resonant tank, may be used for the primary or secondary resonant tank. A half-bridge switch network of S11 and S12 and an output capacitor Co form an output circuit 182 to produce an output Vo. If desired, a full-bridge switch network may be used in the output circuit. Furthermore, multiple secondary resonant circuits and output circuits may be used to produce multiple outputs if needed. Through proper duty cycle and/or switching frequency control, Sp1 can work in zero-voltage switching, and the converter can output an output voltage in a suitable range.

Figure 26:
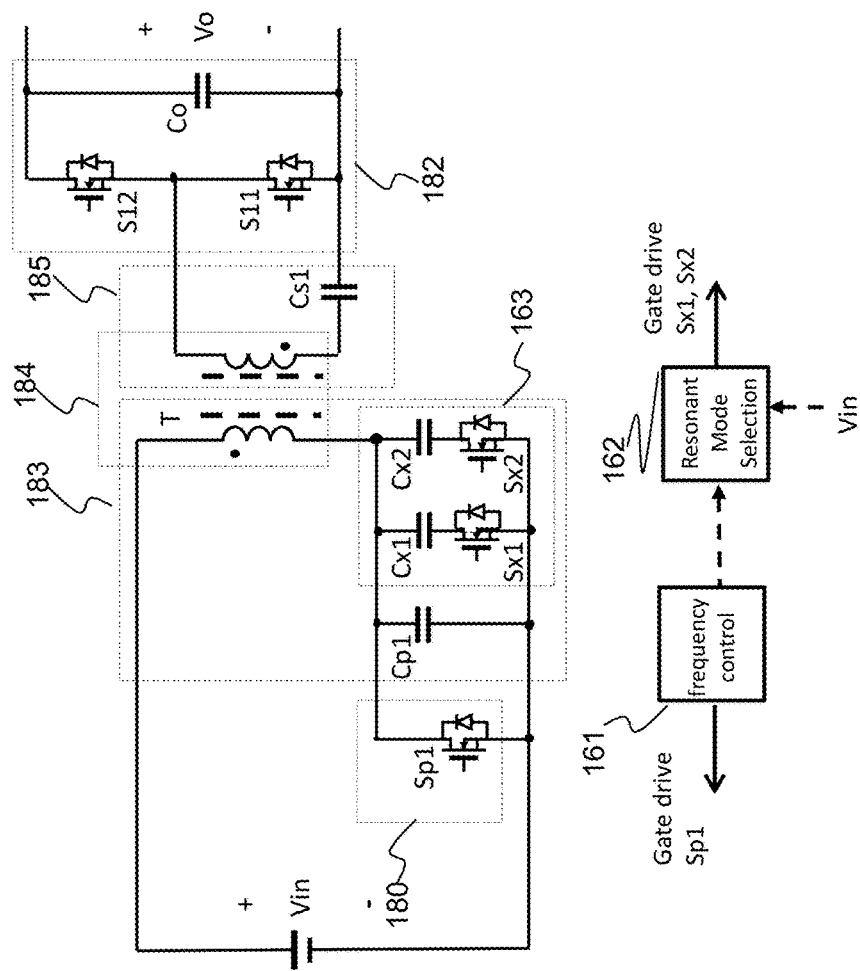
FIG. 26 illustrates an embodiment of a half-bridge resonant power converter in accordance with various embodiments of the present disclosure.

The switched resonant mode operation can be applied to this resonant converter by making Cp1, Cs1, or both changeable. FIG. 26 shows an implementation example to change the equivalent capacitance of Cp1. In the embodiment of FIG. 26, a switchable capacitor network 163 consisting of Cx1, Cx2, Sx1 and Sx2 is put in parallel with Cp1. A resonant mode selection block 162 can use Vin or frequency information in frequency control block 161 to decide the status of Sx1 and Sx2, and thus choosing the right resonant mode for the primary resonant tank, so a good performance can be obtained with a low implementation cost. Please note that the capacitance of Cs1 in the secondary resonant tank 185 may also be changed dynamically. To reduce cost, it's better to adjust Cs1 just according to a variable in the secondary circuit, such as an output voltage change or load change.

With the switching frequency range of a resonant converter reduced by the switched resonant mode technique, resonant gate drivers such as the ones described in FIGS. 15(a), 15(b), 15(c) and 15(d) can be more easily used. For a single-end topology such as the one shown in FIG. 26, a simpler resonant gate drive topology shown in FIG. 27 may be used. In this embodiment, switch network 180 consisting of switches S1 and S2 converts a dc drive voltage Vcc into a pulse waveform, and couples the waveforms to a resonant tank 183, which consists of a resonant inductor Lg, and a resonant capacitor Cgs. Lg may consist of a parasitic inductance in the gate path, such as PCB trace inductance and/or bond wire inductance coupled between the switch network 180 and the gate and source of the main power switch, as well as any added discrete inductor. Cgs may include parasitic capacitance such as any PCB trace or Pad capacitance and the input capacitance of the main power switch (not shown in the figure) which is driven by this gate drive circuit, and may include any added discrete capacitor. Switch S3 is optional and may clamp the gate-source voltage and ensure the turn-off of the main power switch, as will be discussed later. FIG. 28 shows a phase diagram of an intended operation of the gate drive circuit in FIG. 27. Similar to the drive circuit shown in FIG. 15(a) and the phase diagram in FIG. 15(b), the resonant gate drive circuit shown in FIG. 27 may utilize the concept of composite driving technique where the resonant tank in the gate drive circuit may operate in more than one states in the charging phase and discharging phase of a switching cycle.

The gate drive circuit's operation can be explained more clearly with the help of the phase diagram shown in FIG. 28. We can investigate first the operation of the circuit without S3. Assuming initially the circuit is at the following condition:

$Vgs=0, Ig \approx Vcc/Zo$, where $Zo$ is the characteristic impedance of the resonant tank, i.e. the square root of $(Lg/Cgs)$.

This corresponds to point A in FIG. 28. To initiate a turn-on process for the main switch, S2 should be turned off, and S1 should be turned on. Then the state variable (Vgs, Ig) of the resonant tank 183 will move clockwise along the arc GAB in the phase diagram. The arc GAB is part of a circuit (the resonant circle) with its center at (0, 0) and a radius of about Vcc. This is a resonant state, and during this state, Vgs gradually increases, while Ig gradually decreases, both in a sinusoidal fashion. When Vgs exceeds the gate threshold voltage of the main power switch, the main power switch will turn on. When Vgs approaches Vcc, for example Vgs reaches a level of 90% of Vcc, S1 is turned off and S2 is turned on. This corresponds to point B in FIG. 28. The duration of the resonant state is a little lower than ¼ of the resonant period determined by the values of Lg and Cgs. After this, the state variable (Vgs, Ig) of resonant tank 183 will enter a small arc BCD or a small circle BCDEB in the phase diagram, with the center of the both at (+Vcc, 0). Because the radius of the small circle or small arc is much smaller than Vcc, during this state Vgs fluctuates around Vcc slightly during this mode (for example staying within +/−30% of the average value during this mode), and Ig fluctuates around zero slightly, so roughly the gate voltage of the main power switch can be considered to be pseudo "clamped" around Vcc with a small ripple, which can be designed to be less than a limit suitable for driving the power switch, say within 30% of the average voltage during this state. This state is a pseudo clamped state. Each circle corresponds to a resonant period in time. Because in this state the state variable can circle the center (Vcc, 0) as many times as required, the gate drive voltage can stay at a level suitable for driving a switch in the pseudo "clamped" mode for a relatively long and controllable time, which is terminated by the start of the turn-off phase at point D. Therefore, by adjusting the duration of the pseudo clamped mode, the on time of the main switch can be controlled, and thus the duty cycle and/or the switching frequency of the power converter can be controlled. Point D is a mirror to Point B along Vgs axis, at which Vgs is the same as at Point B, but Ig changes direction compared to at point B. At this point S2 is turned off and S1 is turned on, so the state variable of the resonant tank 183 will moves clockwise along the arc DFGA in the phase diagram shown in FIG. 28. Ideally, the arc DFGA is part of the resonant circle with its center at (0, 0) and a radius of about Vcc. During the first part of this resonant state, Vgs gradually decreases, while Ig gradually increases, both in a sinusoidal fashion. When Vgs moves below the gate threshold voltage of the main power switch, the main power switch will turn off. After this, the state variable of the resonant tank 183 continues to move along the arc DFGA, with Vgs and Ig both changes polarity along the course, and reaches point A at the end. The time duration of the resonant state from point D to point A is about ¾ of a resonant period. Then next switching cycle begins repeating the above process.

Figure 27:
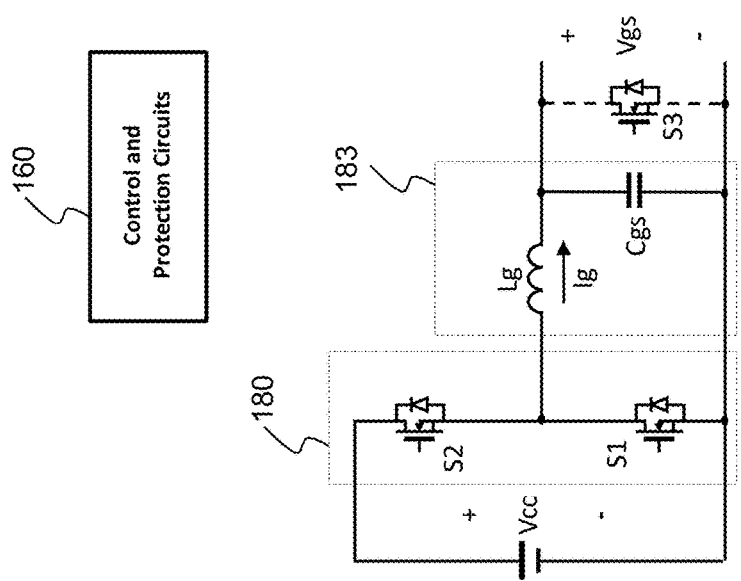
FIG. 27 illustrates an embodiment of a gate drive circuit for a power converter in accordance with various embodiments of the present disclosure.
Figure 28:
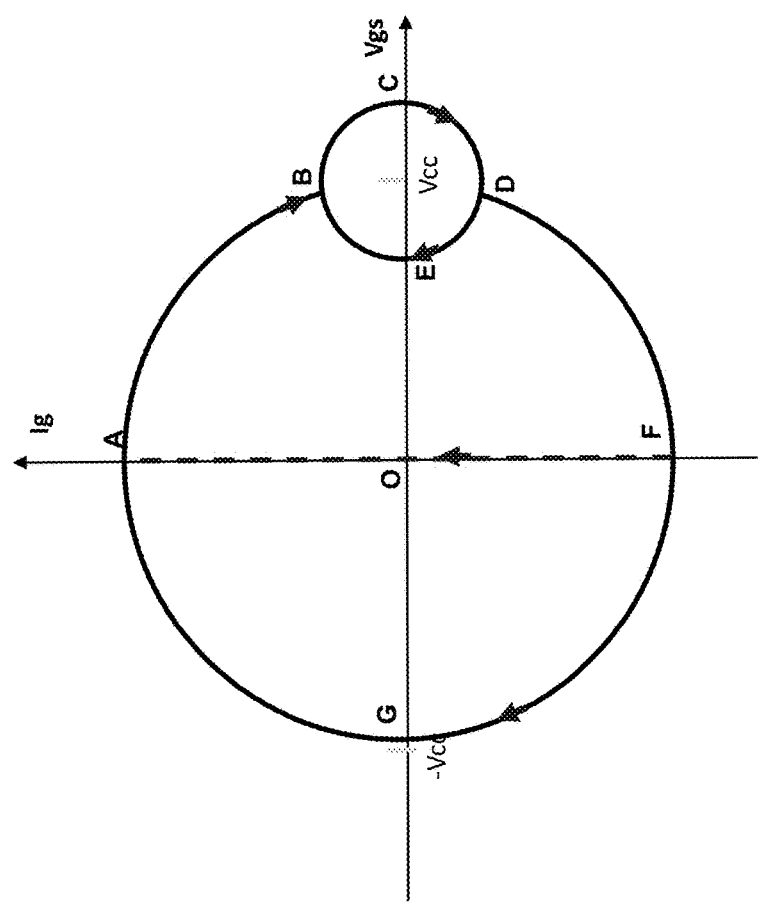
FIG. 28 illustrates an embodiment of a phase diagram of the gate drive circuit shown in FIG. 27 in accordance with various embodiments of the present disclosure.

With the circuit in FIG. 27 and the phase diagram in FIG. 28, the duration of main power switch's OFF state is relatively fixed. By adjusting the relative duration of the pseudo clamp mode, the drive circuit's operation is more independent of the resonant tank parameters, and the transition time between a switch's states can be faster than in traditional control. Moreover, the duty cycle of the main switch can even be adjusted in certain degree. A potential shortcoming is that the main switch's turn-off time and duration may not be fully controlled. To improve this, S3 can be add as shown in the dotted line in FIG. 27. The operation of the circuit with S3 connected is basically the same during the turn-on process and the first part of the turn-off transition of the main power switch, during which S3 is turned off. The difference starts when the state variable of the resonant tank 183 reaches point F. At point F, due to conduction of the body diode or anti-parallel diode of S3, the state trajectory will stop movement, so Vgs is clamped at zero, with Ig equal to −Vcc/Zo. This is a first gate freewheeling state, during which S3 may be gated on to reduce the power loss. Ignoring the conduction loss of the drive current path, this state can be as long as forever. In a practical operation, even with the conduction loss considered this state can last a long enough time to allow a good duty cycle control of most power converters. When it is desired to start a turn-on process for the main power switch, S1 can be used off and S2 can be turned on possible. Please note that S2 may be turned on with zero-voltage as the negative Ig can force the body diode of S2 to conduct before S2 is gated on. During this state of the operation, the state variable of the resonant tank 183 moves along the dotted straight line FOA in the phase diagram. During this state, Vgs is clamed to zero by S3, but Ig is charged linearly by Vcc, so this stage can be called inductor charging stage. If S3 was not gated on previously, it can be gated on before Ig reaches zero. Also, during this stage if S2 is turned off and S1 is turned on, the gate drive circuit can enter into second gate freewheeling stage in which Vgs is clamped zero, and Ig doesn't change. If Ig is close to zero, then the power loss in the gate drive circuit is very small in this state. Therefore, it may be desirable to use this second gate freewheeling state alone or in combination with the first gate freewheeling state to control the turn-off time of the main switch. When the state variable reaches point A, S2 and S3 can be turned off, and S1 can be turned on. The positive Ig makes it possible to turn on S1 with zero-voltage. After this, the resonant gate drive circuit enters the resonant stage in the turn-on process as discussed above.

At any time the main switch needs to be turned off such as in a faulty condition or shut-down operation, S1 and S2 should be turned off and S3 can be turned on. In this way, the turn-on of S3 can ensure the turn-off of the main power switch. Similar turn-off mechanism can be applied to the gate drive circuit shown in FIG. 15(c), where with proper circuit parameters, Sg3 in secondary circuit block 186 can reduce the output gate voltage of Drive 3 to close to zero when the switch network 180 produces zero voltage, i.e. when both S1 and S4 (or alternatively both S2 and S3) are turned on. If similar circuit is used for other drives, all main power switches may have a long turn-off state, which allow a power converter to be in a shut-down or fault-protection mode.

Another consideration is the start-up of a resonant gate drive circuit. It is interesting to know that the state trajectory during the resonant states in both the phase diagrams shown in FIG. 15(b) and FIG. 28 is part of a resonant circle with its center at (0, 0) and a radius of about Vcc. Since the initial condition of the state variables of the resonant gate drive circuit is (0, 0), the gate-drive start-up can start with Vcc being applied to the resonant tank in the circuit. In the circuits shown in FIGS. 15(a) and 15(c), it means turn-on of S2 and S4 while turn-off of S1 and S3. In the circuit shown in FIG. 27, it means turn-on of S2 and turn-off of S1 and S3 (if it is connected). This will force the state variables of the gate drive resonant tank to move a long a start-up circle with its center at (Vcc, 0) and a radius of Vcc in the phase diagram. This start-up circle will cross the resonant circle after about ⅛ resonant period. At the cross point, Vgs is about 70% of Vcc. Therefore, the cross point can be determined by timing the duration of start-up state, or by comparing Vgs to a value close to 70% of Vcc. At the cross over point, the gate drive start-up process is over, and the status of switches in a gate drive circuit can be changed to the corresponding switch status in the corresponding resonant state as discussed above. According to this gate-drive start-up scheme, it only needs about ⅛ resonant period of the drive resonant tank to bring the gate drive circuits into normal operation. Once the gate drive circuit can start normal operation, the switch frequency and/or duty cycle of main power switches should be changed to reduce voltage and current stresses in a soft-start process, as discussed previously.

The key to the above drive schemes is to accomplish correct control timing for the drive switches S1 through S4. These switches' ON and OFF instants can be timed according to the duration of each state as discussed previously. However, when the resonant inductor and resonant capacitor, and thus the resonant period, have relatively big tolerance, it is difficult to do such fixed timing without careful measurement or calibration of the resonant elements or resonant period. Alternatively, the correct timing may be determined by comparing the resonant capacitor voltage to given reference points (such as a value close to +Vcc or −Vcc), and/or comparing the resonant inductor current to given reference points, such as zero or Vcc/Zo, so this is basically a drive scheme with feedback. The measurement of capacitor voltage is relatively straight-forward. The measurement of resonant inductor current (such as Ig) can be done on a resistor in the gate drive path, or through current mirrors of the gate drive switches. With modern analog and digital techniques, the signal sensing and processing according to the above schemes are all possible, and the sensitive part of a gate drive circuit may be implemented on an integrated circuit.

This resonant gate drive circuit is actually a resonant power converter. The circuit and technique discussed here can also be used in resonant power converters with straight-forward modifications to suit the output requirements of the converter.

Because the dynamic power supply has high bandwidth requirements, the power synthesizer needs to work at very high frequency. Power integration techniques can be used to improve efficiency and reduce noise whenever possible. The switches are arranged in totem pole configurations in the synthesizer. In one embodiment, the two switches and their drive circuit in a totem pole are integrated together in a single die or a single package. In another embodiment, the four switches in a basic four-level cell and their drive circuits are integrated in a single die or package. In other embodiments, all switches of a power synthesizer and their gate drive circuit are better to be integrated into a single die, or into a single package. The control circuit of the synthesizer can be integrated too. It's preferable to include some bypass capacitors, such as C2, C3 and C4 in FIG. 21 in the same package or the same die as the switches. If possible, the power supply switches (for example S1 through S4 and S1d in FIG. 21) can also be integrated into the same die or the same package. The drive circuit and control circuit of the multi-output power supply can be also integrated into the die or the package. In an embodiment, the active components and key passive components of the whole dynamic power supply can be integrated into a package, with one or more semiconductor dies and optional discrete passive components. Finally, the power amplifier itself can be integrated with the power solution in a single die, or in a multi-chip module package. In this way, the effect of package parasitics can be minimized, and optimum performance can be achieved.

The above discussion of the advanced power solutions is made mainly in the context of power amplifier applications, since power amplifiers are a very suitable target for high performance power technologies. However, the applications of the power technologies discussed are not limited to power amplifiers, and can be used in any other applications, devices and equipment which require high efficiency power conversion and power control. The power technologies can be used in stand-alone power devices, power chips, power modules and power supplies systems, or be used in devices or systems with power solutions as a built-in function.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
    a resonant tank comprising a resonant inductor and a resonant capacitor, wherein the resonant capacitor comprises capacitance across an output port of the device; and
    a switch network coupled to an input port having an input voltage and having a plurality of switches, wherein the switches are controlled such that the resonant tank goes through a first resonant state and a first pseudo clamp state consecutively during a switching period, and wherein a voltage of the resonant capacitor oscillates around the input voltage for a variable time during the pseudo clamp state.

2. The device of claim 1, wherein the resonant tank goes through a second resonant state and a second pseudo clamp state consecutively during a switching period, wherein a waveform of the resonant capacitor voltage in the second resonant state and in the second pseudo clamp state is opposite to the waveform in the first resonant mode and in the first pseudo clamp state respectively.

3. The device of claim 1, wherein the resonant tank includes a transformer having a primary winding and a plurality of secondary windings coupled to a plurality of secondary circuits, and wherein the resonant inductor comprises a leakage inductance of a transformer winding.

4. The device of claim 3, wherein the plurality of secondary circuits comprise a plurality of a voltage shifting circuit configured to adjust a dc component of a voltage across the output port.

5. The device of claim 4, wherein the secondary circuits are configured to be coupled to a plurality of power switches and the voltage shifting circuit is configured to generate an overlap time or a dead time between gate voltages of two power switches.

6. The device of claim 1, wherein a duration of the pseudo clamp state is configured to function as a buffer by allowing the resonant tank to resonate for a variable number of resonant periods.

7. The device of claim 1, wherein the resonant inductor comprises a parasitic inductance in a circuit path.

8. The device of claim 1, wherein the switch network comprises a clamp switch coupled to the resonant tank to clamp a voltage of the output port to zero for a duration of time.

9. The device of claim 1, wherein a control block comprises a circuit comparing a signal representing a resonant capacitor voltage or a resonant inductor current with a reference point to generate control signals for the switch network.

10. The device of claim 1, wherein the output port is coupled to a power switch and the switch network is configured to control the duty cycle of the power switch.

11. The device of claim 1, wherein a control block is configured such that a soft-start is achieved by applying the input voltage to the resonant tank for about ⅛ of a resonant period of the resonant tank.

12. The device of claim 1, wherein the output port is coupled to a power switch and the switch network comprises a turn-off switch coupled between the drive-resonant tank and the output port, and wherein the turn-off switch is configured to control the turn-off time of the power switch by adjusting a duration of a gate freewheeling state.

13. An apparatus for driving a power switch having a control port, comprising:
    A drive output port configured to be coupled to the control port;
    a first drive resonant tank comprising a first resonant inductor and a first resonant capacitor,
    wherein the first resonant capacitor comprises a capacitance across the drive output port; and
    a switch network having a plurality of drive switches coupled between an input voltage port having an input voltage and the first resonant inductor, wherein the drive switches are controlled such that the drive resonant tank goes through a first resonant state and a first pseudo clamp state consecutively during a switching period, and wherein a voltage across the first resonant capacitor resonates around the input voltage for a variable time during the pseudo clamp state.

14. The apparatus of claim 13, wherein a clamp switch is coupled to the drive output port to clamp a voltage of the output port to zero for a duration of time.

15. The apparatus of claim 13, wherein a transformer and a second resonant capacitor is coupled between the switch network and the drive output port, and
    wherein a secondary winding of the transformer is coupled to the first resonant capacitor, and the first resonant inductor comprises a leakage inductance of the secondary winding; and
    wherein the second resonant capacitor is coupled between the switch network and a primary winding of the transformer.

16. The apparatus of claim 15, wherein a voltage shifting circuit is coupled between the secondary winding and the drive output port to adjust the dc component of a voltage of the drive output port.

17. A method for controlling a resonant tank, comprising:
configuring a resonant tank comprising a resonant inductor and a resonant capacitor;
providing a switch network comprising a plurality of switches coupled between an input port with a voltage of Vcc and the resonant tank; and
controlling the drive switches such that during a switching period the resonant tank goes through a resonant state and a pseudo clamp state consecutively, wherein a trajectory in a state plane moves along a first circular arc centered at (0, 0) in the resonant state, and moves along a second circular arc centered at (Vcc, 0) in the pseudo clamp state, and wherein a voltage of the resonant capacitor oscillates around Vcc for a variable duration.

18. The method of claim 17, further comprising setting a duration of the switching period by allowing the trajectory during the pseudo clamp state to circle around (Vcc, 0) a plurality of times.

19. The method of claim 17, further comprising coupling a clamp switch across the resonant capacitor and controlling a duration during which the voltage of the resonant capacitor is clamped at zero by adjusting a duration of a freewheeling state.

20. The method of claim 17, further comprising achieving a soft start of the resonant tank by applying Vcc to the resonant tank for about $\frac{1}{8}$ of a resonant period of the resonant tank at the start.

* * * * *